(12) United States Patent
Gardner et al.

(10) Patent No.: US 12,170,326 B2
(45) Date of Patent: Dec. 17, 2024

(54) THREE-DIMENSIONAL DEVICE WITH VERTICAL CORE AND BUNDLED WIRING

(71) Applicant: Tokyo Electron Limited, Tokyo (JP)

(72) Inventors: Mark I. Gardner, Ceer Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 477 days.

(21) Appl. No.: 17/453,518

(22) Filed: Nov. 4, 2021

(65) Prior Publication Data

US 2022/0293523 A1 Sep. 15, 2022

Related U.S. Application Data

(60) Provisional application No. 63/159,649, filed on Mar. 11, 2021.

(51) Int. Cl.
| | |
|---|---|
| *H01L 29/66* | (2006.01) |
| *H01L 21/8234* | (2006.01) |
| *H01L 29/78* | (2006.01) |
| *H01L 29/786* | (2006.01) |
| *H01L 21/8238* | (2006.01) |

(52) U.S. Cl.
CPC ............ *H01L 29/66666* (2013.01); *H01L 21/823487* (2013.01); *H01L 29/7827* (2013.01); *H01L 29/78642* (2013.01); *H01L 21/823885* (2013.01)

(58) Field of Classification Search
CPC ..... H01L 21/823475; H01L 21/823487; H01L 29/66666; H01L 29/7827
See application file for complete search history.

(56) References Cited

U.S. PATENT DOCUMENTS

| | | | |
|---|---|---|---|
| 2005/0184348 A1* | 8/2005 | Youn | H01L 29/4908 257/E29.151 |
| 2012/0217468 A1* | 8/2012 | Tekleab | H01L 29/0676 438/270 |
| 2021/0305431 A1* | 9/2021 | Ishimaru | H01L 29/401 |
| 2022/0254690 A1* | 8/2022 | Fulford | H01L 29/7831 |
| 2022/0254925 A1* | 8/2022 | Gardner | H01L 21/823878 |

* cited by examiner

*Primary Examiner* — Zandra V Smith
*Assistant Examiner* — Molly K Reida
(74) *Attorney, Agent, or Firm* — Oblon, McClelland, Maier & Neustadt, L.L.P.

(57) ABSTRACT

A semiconductor device includes a buried power rail (BPR) over a substrate and a semiconductor structure over the BPR. The semiconductor structure is tube-shaped and extends along a vertical direction. The semiconductor structure includes a first source/drain (S/D) region over the BPR, a gate region over the first S/D region, and a second S/D region over the gate region. The semiconductor device includes a first S/D interconnect structure extending from the BPR and further into the semiconductor structure such that a top portion of the first S/D interconnect structure is surrounded by the first S/D region. The semiconductor device includes a gate structure that includes (i) a gate oxide formed along an inner surface of the gate region and (ii) a gate electrode formed along sidewalls of the gate oxide in the gate region. The semiconductor device includes a second S/D interconnect structure positioned over the second S/D region.

20 Claims, 26 Drawing Sheets

THREE-DIMENSIONAL DEVICE WITH VERTICAL CORE AND BUNDLED WIRING

CROSS REFERENCE TO RELATED APPLICATIONS

This present application claims the benefit of priority to U.S. Provisional Application No. 63/159,649 filed on Mar. 11, 2021, which is incorporated by reference herein in its entirety.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein include methods and devices for 3D fabrication of semiconductor devices. Techniques include using a vertical dielectric core, which can be replaced to make both 3D devices and also metal routing and connections by using dielectric core regions of the vertical dielectric core. In related examples, a dielectric core for 3D vertical nano sheets/transistors is discussed, but the dielectric core may not be used for vertical routing and device hookup. The current disclosure, however, provides several process flows to achieve such a vertical routing feature, and to enable a relatively high packing density of corresponding circuits. Routing can be made in multiple 360 degree shells of metal routing. Any geometry can be used (e.g., circle, rectangle, or cylinder) for the dielectric core. Using a vertical dielectric core with vertical nano sheets greatly increases the density of metal lines relative to a horizontal 3D nano sheet device. Techniques provide a more robust use of the BPR (Buried power line routing). Embodiments of the disclosure include a pass through of one or two multiple 3D vertical lines to upper transistor and/or layout connections. In addition, separate gate bias of the inner gate core can be enabled. Of course, separate gate bias of the outer gate core can also be applied. Gate channel lengths can be formed with differential channel lengths. Device architecture with device build on a 3D interior 360 degree shell (may be circular, rectangular, or elliptical) is provided. Device architecture with device build on a 3D interior and exterior 360 degree shell (may be circular, rectangular, or elliptical) is provided.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device can include a buried power rail (BPR) formed over a top surface of a substrate, where the substrate includes an opposing bottom surface. The semiconductor device can include a semiconductor structure formed over the BPR. The semiconductor structure can be tube-shaped and extend along a vertical direction perpendicular to the substrate. The semiconductor structure can further include a first source/drain (S/D) region over the BPR, a gate region over the first S/D region, and a second S/D region over the gate region. The semiconductor device can include a first S/D interconnect structure extending from the BPR and further into the semiconductor structure such that a top portion of the first S/D interconnect structure is surrounded by the first S/D region of the semiconductor structure. The semiconductor device can also include a gate structure that includes (i) a gate oxide formed along an inner surface of the gate region and (ii) a gate electrode formed along sidewalls of the gate oxide in the gate region such that the gate electrode is surrounded by the gate region. The semiconductor device can further include a second S/D interconnect structure positioned over and coupled to the second S/D region.

In some embodiments, a cross-section of the semiconductor structure obtained along a direction parallel to the substrate can include one of a circular ring shape, a square ring shape, a rectangular ring shape, and an oval ring shape.

In the gate structure, the gate oxide can further be formed along an inner surface of the second S/D region, and the gate electrode can include a first portion arranged along the sidewalls of the gate oxide in the gate region and a second portion extending from the first portion and through the second S/D region such that a top surface of the second portion of the gate electrode is over a top surface of the second S/D region.

The semiconductor device can include a first dielectric layer positioned in the first S/D region. The first dielectric layer can be arranged between the first S/D interconnect structure and the gate electrode, and further surrounded by the first S/D region. The semiconductor device can include a second dielectric layer positioned over the first portion of the gate electrode and surrounding the second portion of the gate electrode. The second dielectric layer can further be positioned between the gate oxide in the second S/D region and the second portion of the gate electrode. The semiconductor device can also include a gate interconnect contact positioned over and coupled to the second portion of the gate electrode.

In an embodiment, the semiconductor device can include a S/D contact positioned adjacent to the semiconductor structure and extending from the BPR in the vertical direction such that the first S/D interconnect structure is coupled to the S/D contact through the BPR.

In another embodiment, the semiconductor device can include a S/D contact extending through the substrate from the bottom surface of the substrate to contact the BPR, where the first S/D interconnect structure can be coupled to the S/D contact through the BPR.

According to another aspect of the disclosure, a semiconductor device is provided. The semiconductor device can include a BPR formed over a top surface of a substrate, where the substrate can include an opposing bottom surface. The semiconductor device can include a semiconductor structure formed over the BPR. The semiconductor structure can be tube-shaped and extend along a vertical direction perpendicular to the substrate. The semiconductor structure can further include a first S/D region over the BPR, a gate region over the first S/D region, and a second S/D region over the gate region. The semiconductor device can include a first S/D interconnect structure extending from the BPR and further into the semiconductor structure such that a top portion of the first S/D interconnect structure is surrounded by the first S/D region of the semiconductor structure. The semiconductor device can also include a first gate oxide formed along an inner surface of the gate region and an inner surface of the second S/D region, and a second gate oxide formed along an outer surface of the gate region and an outer surface of the second S/D region to surround the gate region and the second S/D region. The semiconductor device can further include a first gate electrode formed along sidewalls of the first gate oxide in the gate region such that the first gate electrode is surrounded by the gate region, and a second gate electrode formed along sidewalls of the second gate oxide to surround the gate region. The semiconductor device can include a second S/D interconnect structure positioned over and coupled to the second S/D region.

In some embodiments, a cross-section of the semiconductor structure obtained along a direction parallel to the substrate can include one of a circular ring shape, a square ring shape, a rectangular ring shape, and an oval ring shape.

The semiconductor device can also include a first dielectric layer. The first dielectric layer can include (i) a first portion positioned between the first S/D interconnect structure and the first gate electrode and surrounded by the first S/D region, and (ii) a second portion formed along an outer surface of the first S/D region so as to surround the first S/D region. The semiconductor device can include a first gate interconnect contact positioned over and coupled to the first gate electrode, and a second gate interconnect contact positioned over and coupled to the second gate electrode.

In some embodiments, the first gate electrode can include a first portion arranged along the sidewalls of the first gate oxide in the gate region and a second portion. The second portion can extend from the first portion of the first gate electrode and through the second S/D region such that a top surface of the second portion of the first gate electrode is substantially level with a top surface of the second S/D region. The second gate electrode can include a first portion arrange along the sidewalls of the second gate oxide in the gate region and a second portion. The second portion can extend from the first portion of the second gate electrode in the vertical direction such that a top surface of the second portion of the second gate electrode is substantially level with the top surface of the second S/D region.

The semiconductor device can include a second dielectric layer. The second dielectric layer can include a first portion positioned over the first portion of the first gate electrode and surrounding the second portion of the first gate electrode, where the first portion of the second dielectric layer can be positioned between the first gate oxide in the second S/D region and the second portion of the first gate electrode. The second dielectric layer can also include a second portion positioned over the first portion of the second gate electrode and surrounded by the second portion of the second gate electrode. The second portion of the second dielectric layer can further be positioned between the second portion of the second gate electrode and the second gate oxide in the second S/D region.

In an embodiment, the semiconductor device can include a S/D contact positioned adjacent to the semiconductor structure and extending from the BPR in the vertical direction such that the first S/D interconnect structure is coupled to the S/D contact through the BPR.

In another embodiment, the semiconductor device can include a S/D contact extending through the substrate from the bottom surface of the substrate to contact the BPR, where the first S/D interconnect structure can be coupled to the S/D contact through the BPR.

According to yet another aspect of the disclosure, a method of manufacturing a semiconductor device is provided. In the method, a BPR can be formed over a top surface of a substrate, where the substrate can include an opposing bottom surface. A semiconductor structure can be formed over the BPR. The semiconductor structure can be tube-shaped to include an inner surface and an outer surface. The semiconductor structure can extend along a vertical direction perpendicular to the substrate, and include a first S/D region over the BPR, a gate region over the first S/D region, and a second S/D region over the gate region. A first S/D interconnect structure can be formed to extend from the BPR and further into the first S/D region of the semiconductor structure such that a top portion of the first S/D interconnect structure is surrounded by the first S/D region of the semiconductor structure. A first dielectric layer can be formed over the first S/D interconnect structure in the first S/D region of the semiconductor structure such that the first dielectric layer is surrounded by the first S/D region of the semiconductor structure. A first gate oxide can be formed along the inner surface of semiconductor structure and over the first dielectric layer. A first gate electrode can be formed along sidewalls of the first gate oxide in the gate region of the semiconductor structure such that the first gate electrode is surrounded by the gate region. A second dielectric layer can be formed along the sidewalls of the first gate oxide and over the first gate electrode such that the second dielectric layer is surrounded by the second S/D region of the semiconductor structure.

In the method, a second S/D interconnect structure can be formed to be positioned over and coupled to the second S/D region of the semiconductor structure. Further, a first gate interconnect contact can be formed to be positioned over and coupled to the first gate electrode.

In some embodiment, the first dielectric layer can further be formed along the outer surface of the semiconductor structure so as to surround the first S/D region of the semiconductor structure.

In the method, a second gate oxide can be formed along the outer surface of semiconductor structure and over the first dielectric layer, and a second gate electrode can be formed along sidewalls of the second gate oxide to surround the gate region of the semiconductor structure.

In some embodiments, in order to form the first gate electrode, a first portion of the first gate electrode can be formed along the sidewalls of the first gate oxide in the gate region such that the first portion of the first gate electrode is surrounded by the gate region of the semiconductor structure. Further, a second portion of the first gate electrode can be form to extend from the first portion of the first gate electrode and through the second S/D region such that a top surface of the second portion of the first gate electrode is substantially level with a top surface of the second S/D region.

In some embodiments, in order to form the second gate electrode, a first portion of the second gate electrode can be formed along the sidewalls of the second gate oxide in the gate region such that the first portion of the second gate electrode surrounds the gate region. Further, a second portion of the second gate electrode can be formed to extend from the first portion of the second gate electrode in the vertical direction such that a top surface of the second portion of the second gate electrode is substantially level with the top surface of the second S/D region.

In some embodiments, in order to form the second dielectric layer, a first portion of the second dielectric layer can be formed over the first portion of the first gate electrode and surround the second portion of the first gate electrode. The first portion of the second dielectric layer can be positioned between the first gate oxide in the second S/D region and the second portion of the first gate electrode. In addition, a second portion of the second dielectric layer can be formed over the first portion of the second gate electrode and surround the second gate oxide in the second S/D region. The second portion of the second dielectric layer can be positioned between the second portion of the second gate electrode and the second gate oxide in the second S/D region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-14, and 17-18 are cross-sectional views of various intermediate steps in a manufacturing flow to fabricate the second exemplary vertical transistor, in accordance with some embodiments.

FIGS. 3-6, and 20-31 are cross-sectional views of various intermediate steps in a manufacturing flow to fabricate the third semiconductor device, in accordance with some embodiments.

FIGS. 3-6, 20-29, and 32-34 are cross-sectional views of various intermediate steps in a manufacturing flow to fabricate the fourth semiconductor device, in accordance with some embodiments.

FIGS. 3-6, 20-21, and 36-41 are cross-sectional views of various intermediate steps in a manufacturing flow to fabricate the fifth semiconductor device, in accordance with some embodiments.

FIGS. 3-6, 20-21, 36-39, and 42 are cross-sectional views of various intermediate steps in a manufacturing flow to fabricate the sixth semiconductor device, in accordance with some embodiments.

DETAILED DESCRIPTION

Figure 1A:
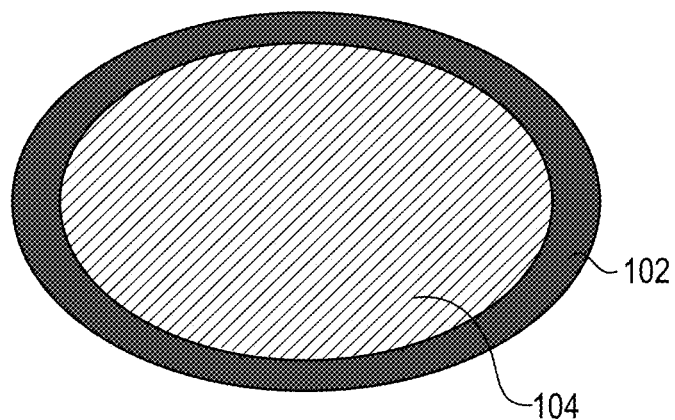
FIG. 1A is a top down view of a vertical transistor in a related example, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Figure 1B:
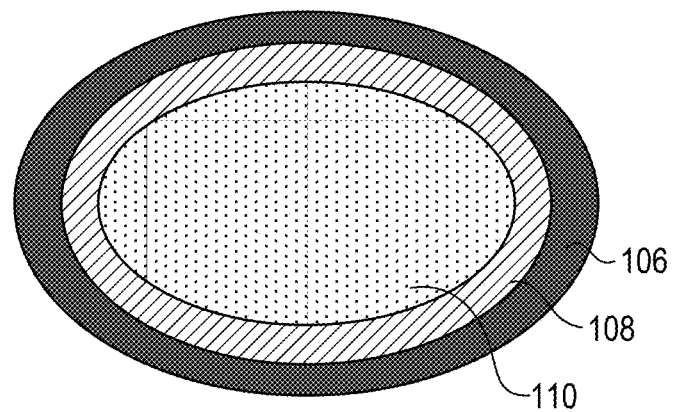
FIG. 1B is a top down view of an exemplary vertical transistor of the disclosure, in accordance with some embodiments.

FIG. 1A shows a top down view of a vertical transistor 100A in a related example that includes a dielectric core 104. As shown in FIG. 1A, the vertical transistor 100A can include a transistor region 102 that surrounds the dielectric core 104. A cross-section of the transistor region 102 can be ring-shaped, such as a circular ring shape or an oval ring shape. FIG. 1B shows a top down view of a 3D vertical channel transistor 100B of the disclosure. The 3D vertical channel transistor 100B can include a dielectric core 108, a metal line 110 for device connection/routing, and a transistor region 106. The metal line 110 can be surrounded by the dielectric core 108, and dielectric core 108 can further be surrounded by the transistor region 106. The transistor region 106 can be made of Si, SiGe, Ge, or any other suitable semiconductor materials. Compared to the vertical transistor 100A in the related example, the 3D vertical channel transistor 100B of the disclosure allows for vertical routing by using a vertical dielectric core (e.g., 108) with vertical Nano sheets (e.g., the transistor region 106) and the metal lines (e.g., 110). Accordingly, a higher packing density of the circuit can be achieved.

Embodiments of the disclosure provide several process flows to form the 3D vertical channel transistor. In a first process flow, an inner metal core can be formed to enable a connection to one of a gate electrode region, a source/drain (S/D) connection, a BPR, and a top contact using an inner core surface for transistor formation. For example, FIGS. 3-16 show a first example of the first process flow that applies a BPR (or buried power rail) from a substrate for the S/D connection. The BPR can be a power rail positioned below active devices, and can be positioned within bulk silicon (e.g., the substrate). FIGS. 3-14, and 17-18 shows a second example of the first process flow in which a top connection for the source/drain is formed. In a second process flow, an inner metal core can be formed to enable a connection to one of a gate electrode region, a S/D connection, a BPR, and a top contact using an inner core surface plus an outer transistor surface for transistor formation. For example, FIGS. 3-6, 20-29, and 32-34 show a first example of the second process flow that uses a BPR from substrate for source connection. FIGS. 3-6 and 20-31 show a second example of the second process flow in which a top connection for the source/drain connection is applied. In a third process flow similar to the second process flow, an inner metal core can also be formed to enable a connection to one of a gate electrode region, a S/D connection, a BPR, and a top contact using an inner core surface plus an outer transistor surface for transistor formation. However, a reduction in metal gate electrode usage can be applied. The third process flow can be illustrated in FIGS. 3-6, 20-21, and 36-41, or in FIGS. 3-6, 20-21, 36-39, and 42.

Figure 2A:
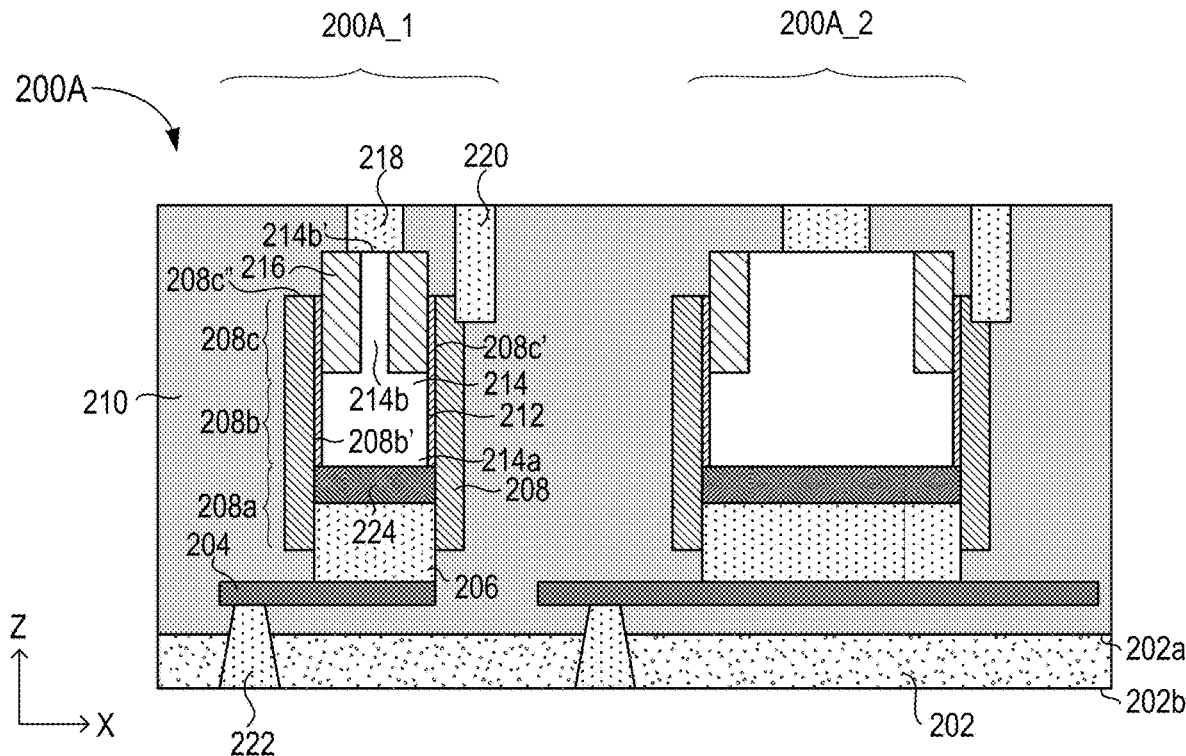
FIG. 2A is a cross-sectional view of a first exemplary vertical transistor, in accordance with some embodiments.

FIG. 2A a cross-sectional view of first exemplary semiconductor device 200A that are formed based on the first process flow. As shown in FIG. 2A, the first semiconductor device 200A can include a first transistor 200A_1 and a second transistor 200A_2 that are formed over a substrate 202. The first transistor 200A_1 and the second transistor 200A_2 can have different dimensions but similar structures. For simplicity and clarity, the structures of the first transistor 200A_1 and the second transistor 200A_2 can be discussed based on the first transistor 200A_1.

The first transistor 200A_1 can include a BPR 204 formed over a top surface 202a of the substrate 202, where the substrate can also include an opposing bottom surface 202b.

The first transistor 200A_1 can include a semiconductor structure (or transistor region) 208 formed over the BPR 204. The semiconductor structure 208 can be tube-shaped and extend along a vertical direction (e.g., Z direction) perpendicular to the substrate 202. Thus, the semiconductor structure 208 can be a shell structure in which a cross-section of the semiconductor structure 208 obtained along a direction (e.g., X direction) parallel to the substrate 202 can include a circular ring shape, a square ring shape, a rectangular ring shape, an oval ring shape, or other geometric shapes. For example, as shown in FIG. 1B, the cross-sectional view of the transistor region 106 can have an oval ring shape. The semiconductor structure 208 can further include a first S/D region 208a over the BPR 204, a gate region 20b over the first S/D region 208a, and a second S/D region 208c over the gate region 208b. The first transistor 200A_1 can include a first S/D interconnect structure 206 extending from the BPR 204 and further into the semiconductor structure 208 such that a top portion of the first S/D interconnect structure 206 is surrounded by the first S/D region 208a of the semiconductor structure 208. The first transistor 200A_1 can also include a gate structure that includes (i) a gate oxide 212 formed along an inner surface 208b' of the gate region 208b and (ii) a gate electrode 214 formed along sidewalls of the gate oxide 212 in the gate region 208b such that the gate electrode 214 is surrounded by the gate region 208b. The first transistor 200A_1 can further include a second S/D interconnect structure 220 positioned over and coupled to the second S/D region 208c.

In some embodiments, the gate oxide 212 can further be formed along an inner surface 208c'' of the second S/D region 208c. In addition, the gate electrode 214 can include a first portion 214a arranged along the sidewalls of the gate oxide 212 in the gate region 208b and a second portion 214b extending from the first portion 214a and through the second S/D region 208c such that a top surface 214b' of the second portion 214b of the gate electrode 214 is over a top surface 208c' of the second S/D region 208c.

The first transistor 200A_1 can include a first dielectric layer 224 positioned in the first S/D region 208a. The first dielectric layer 224 can be arranged between the first S/D interconnect structure 206 and the gate electrode 214, and further surrounded by the first S/D region 208a. The first transistor 200A_1 can include a second dielectric layer 216 positioned over the first portion 214a of the gate electrode 214 and surrounding the second portion 214b of the gate electrode 214. The second dielectric layer 216 can further be positioned between the gate oxide 212 in the second S/D region 208c and the second portion 214b of the gate electrode 214. The first transistor 200A_1 can include a gate interconnect contact 218 positioned over and coupled to the second portion 214b of the gate electrode 214. The first semiconductor device 200A can also include a dielectric structure 210 in which the first transistor 200A_1 and the second transistor 200A_2 are positioned. The dielectric structure 210 can be formed over the substrate 202 and include one or more dielectric layers.

In an embodiment, the first transistor 200A_1 can include a S/D contact 222 extending through the substrate 202 from the bottom surface 202b of the substrate 202 to contact the BPR 204, where the first S/D interconnect structure 206 can be coupled to the S/D contact 222 through the BPR 204.

Figure 2B:
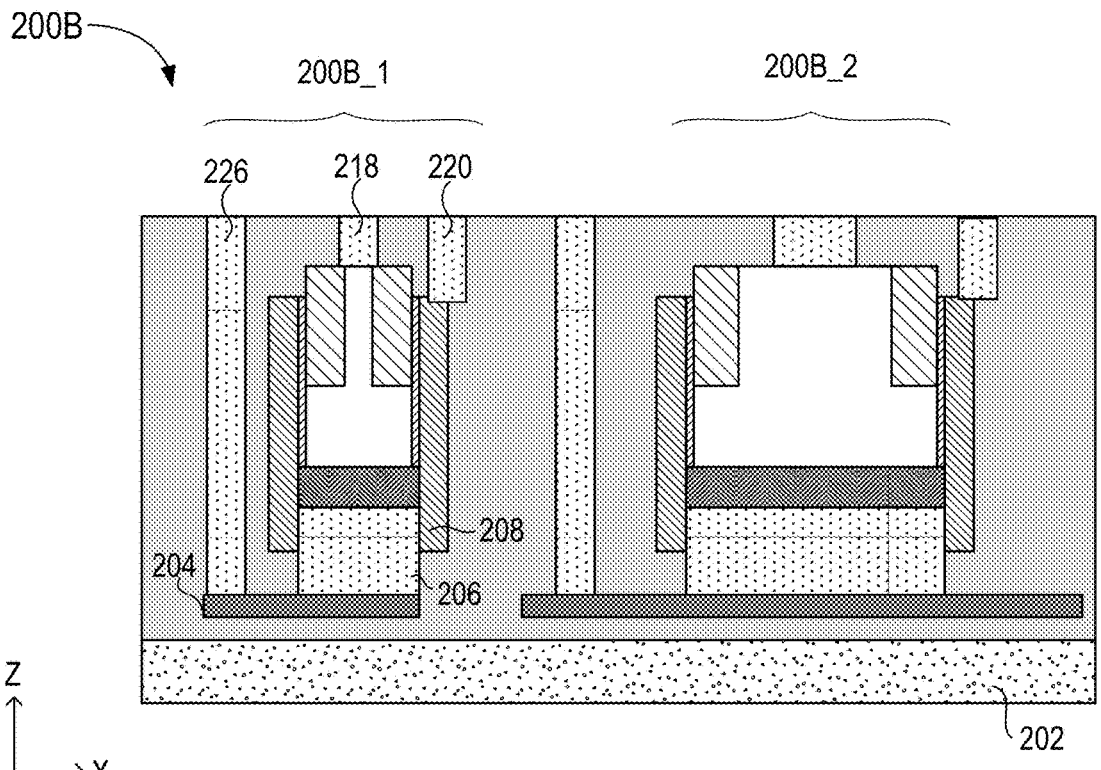
FIG. 2B is a cross-sectional view of a second exemplary vertical transistor, in accordance with some embodiments.

FIG. 2B is a cross-sectional view of second exemplary semiconductor device 200B that are formed based on the first process flow. The second semiconductor device 200B can include a first transistor 200B_1 and a second transistor 200B_2 that may have different dimensions. Compared to the first transistor 200A_1 in semiconductor device 200A, the first transistor 200B_1 in semiconductor device 200B can include a S/D contact 226 that is positioned adjacent to the semiconductor structure 208 and extending from the BPR 204 in the vertical direction (e.g., Z direction) such that the first S/D interconnect structure 206 is coupled to the S/D contact 226 through the BPR 204. Thus, a S/D bias applied to the S/D contact 226 can be transmitted to the first S/D region 208a through the BPR 204 and the first S/D interconnect structure 206.

In some embodiments, the substrate 202 may be a semiconductor substrate such as Si substrate. The substrate 202 may also include other semiconductors such as germanium (Ge), silicon carbide (SiC), silicon germanium (SiGe), or diamond. The semiconductor structure 208 can include Si, Ge, SiGe, or other suitable semiconductor materials. In an embodiment, the semiconductor structure 208 can be p-type doped. In another embodiment, the semiconductor structure 208 can be n-type doped. The dielectric structure 210, the first dielectric layer 224, and the second dielectric layer 216 can include SiO, SiN, SiC, SiCN, SiCON, SiON, or other suitable dielectric materials. The BPR 204, the gate interconnect contact 218, the first S/D interconnect structure 206, the second S/D interconnect structure 220, and the S/D contact 222 can include polysilicon, W, Ru, Co, Cu, Al, or the like. The gate oxide 212 can include $HfO_2$, $ZrO_2$, $HfSiNO_2$, $ZrSiNO_2$, $Y_{304}$, $Si_3N_4$, $Al_2O_3$, $SiO_2$, or the like. The gate electrode 214 can include barrier layers, work function layers and gate fillers. The barrier layers can include TiN, TaN, or the like. The work function layers can include AlTiC, AlTiO, AlTiN, TiON, TiC, the like, or a combination thereof. The gate fillers can include W, Ru, Co, or the like.

Figure 3:
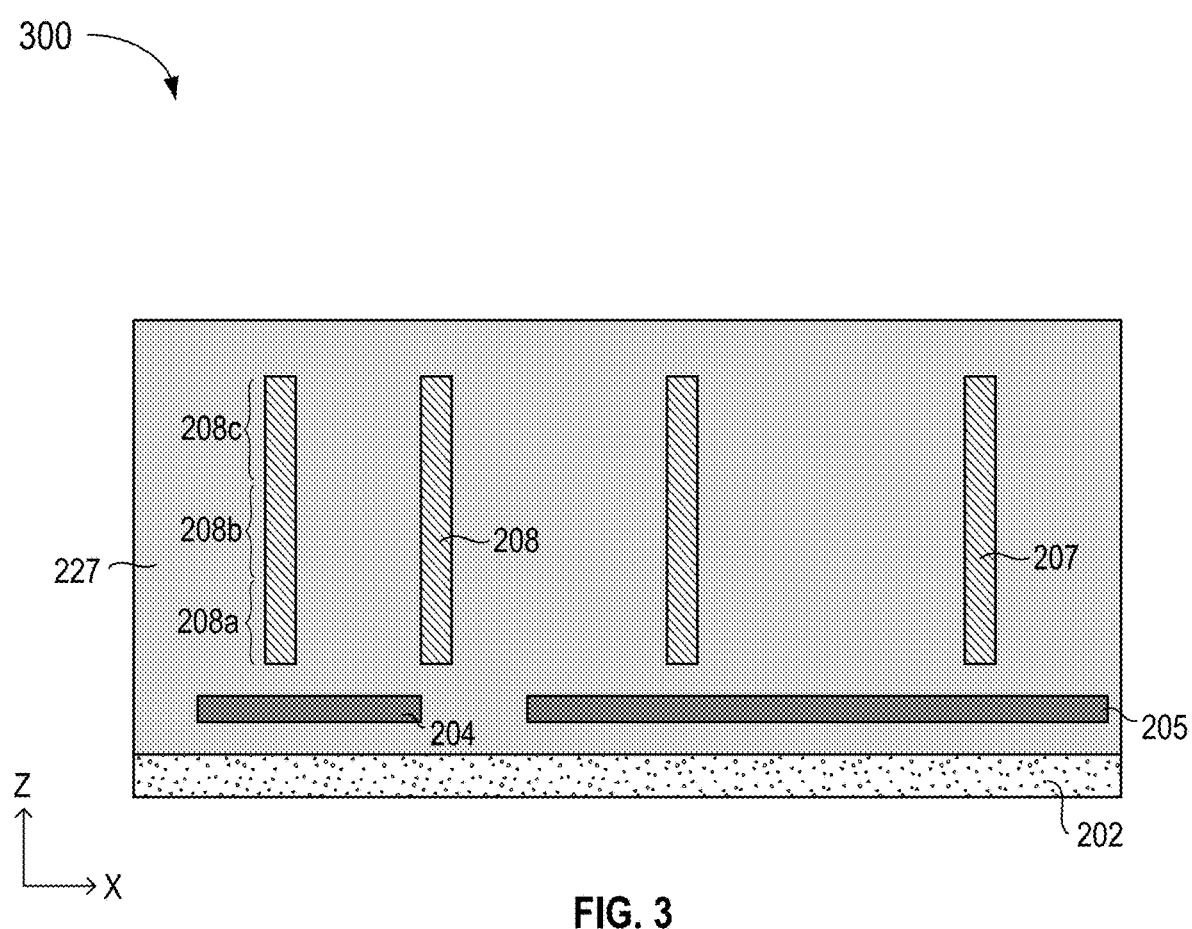
FIGS. 3-16 are cross-sectional views of various intermediate steps in a manufacturing flow to fabricate the first exemplary vertical transistor, in accordance with some embodiments.

FIGS. 3-16 show an exemplary process flow to manufacture the semiconductor device 200A. As shown in FIG. 3, a substrate segment 300 can be provided. The substrate segment 300 can include a plurality of BPRs (e.g., 204 and 205) formed over a substrate 202. Further, a plurality of semiconductor structures (e.g., 207 and 208) can be formed over the BPRs. Each of the semiconductor structures can include a first S/D region (e.g., 208a) over a respective BPR (e.g., 204), a gate region (e.g., 208b) over the first S/D region, and a second S/D region (e.g., 208c) over the gate region. The BPRs and the semiconductor structures can be arranged in a dielectric structure 227. The dielectric structure 227 can include one or more dielectric layers over the substrate 202. In order to form the substrate segment 300, various semiconductor manufacturing processes can be applied, including processes well known by one skilled in the art. The semiconductor manufacturing processes can include a deposition process that can include a chemical vapor deposition (CVD), a physical vapor deposition (PVD), a sputtering, an epitaxial deposition, an atomic layer deposition (ALD), or the like. The semiconductor manufacturing processes can also include an etching process, such as a wet etching or a dry etching. The semiconductor process can further include a photolithographic process, an ion implantation process, a metrology process, an inline parametric characterization process, an inline defect characterization process, and so on.

It should be noted that FIG. 3 shows a cross sectional view of the substrate segment 300 of a completed 3D vertical transistor. In FIG. 3, the semiconductor structures (e.g., 207 and 208) can have a rectangular geometry as one example of the starting point for vertical metal connections. However, a cross-sectional view of the semiconductor structures can have a tube-shaped or be a shell structure, which can be shown in FIG. 1B. The 3D vertical transistor herein can be formed through a dielectric core with a 360 degree transistor or device on silicon or Ge shell (e.g., 207 or 208). Of course, techniques herein can be applied to all vertical dielectric cores. The BPRs in FIG. 3 are shown above the substrate 202 as an example. The BPRs can also be positioned over the semiconductor structures 207-208 to form a top connection.

Figure 4:
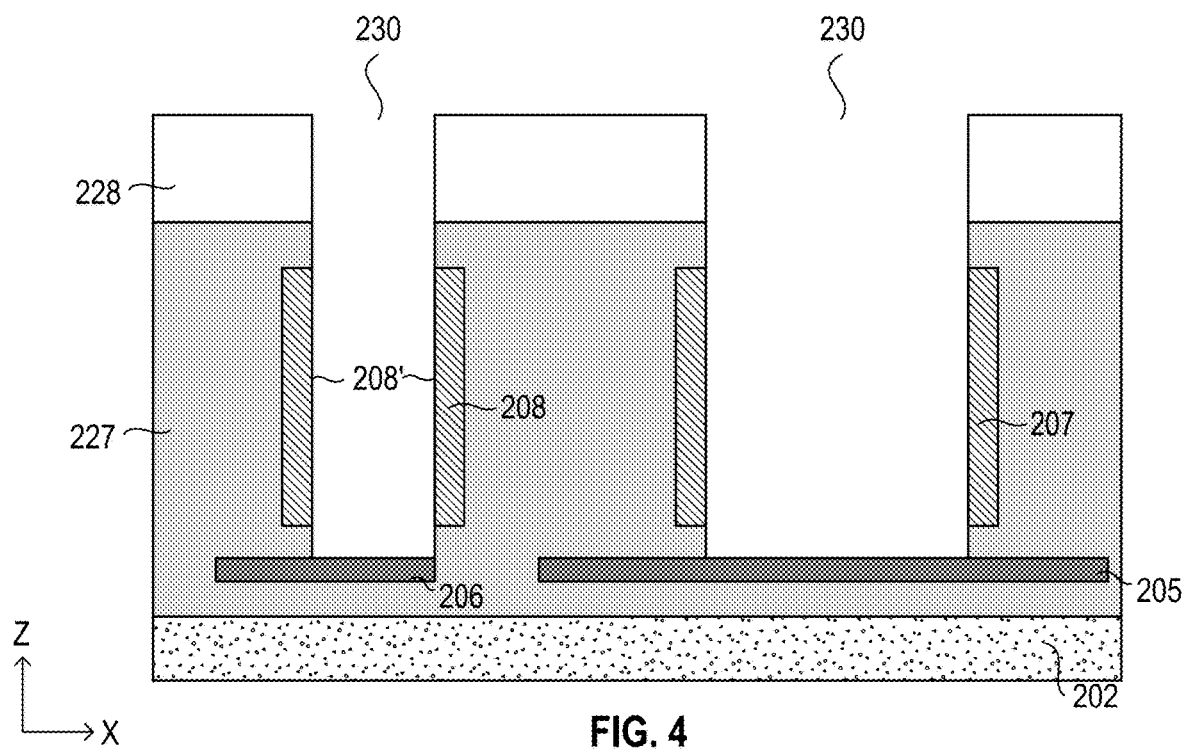

In FIG. 4, an etch mask 228 with patterns can be formed on the dielectric structure 227 and an etching process can further be applied to etching the dielectric structure 227. The etching process can etch the dielectric structure 227 positioned in the core regions 230 of vertical transistor shells (e.g., semiconductor structures 207 and 208) to uncover the core regions 230 of the semiconductor structures. The core regions 230 can have sidewalls along inner surfaces (e.g., 208') of the semiconductor structures (e.g., 207 and 208) and a bottom to uncover the BPRs (e.g., 204 and 205).

Figure 5:
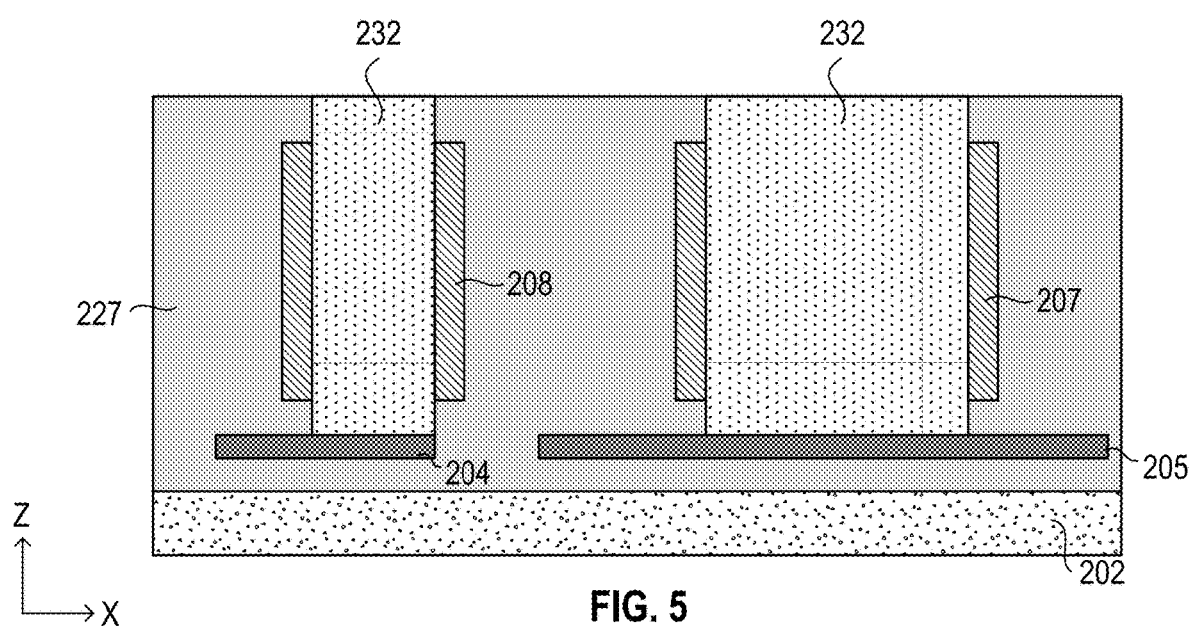

In FIG. 5, the etch mask 228 can be removed and a deposition of conductive material 232 can subsequently be performed to form vertical routing metal. Any overburden of the conductive material 232 can be removed by a surface planarization process, such as an etching back process or a chemical mechanical polishing (CMP) process. The conductive material 232 can be formed by a suitable deposition process, such as a chemical vapor deposition (CVD), a physical vapor deposition (PVD), an atomic layer deposition (ALD), a thermal oxidation, an e-beam evaporation, a sputtering, a diffusion, or any combination thereof. The conductive material 232 can include W, Ru, Co, or the like.

Figure 6:
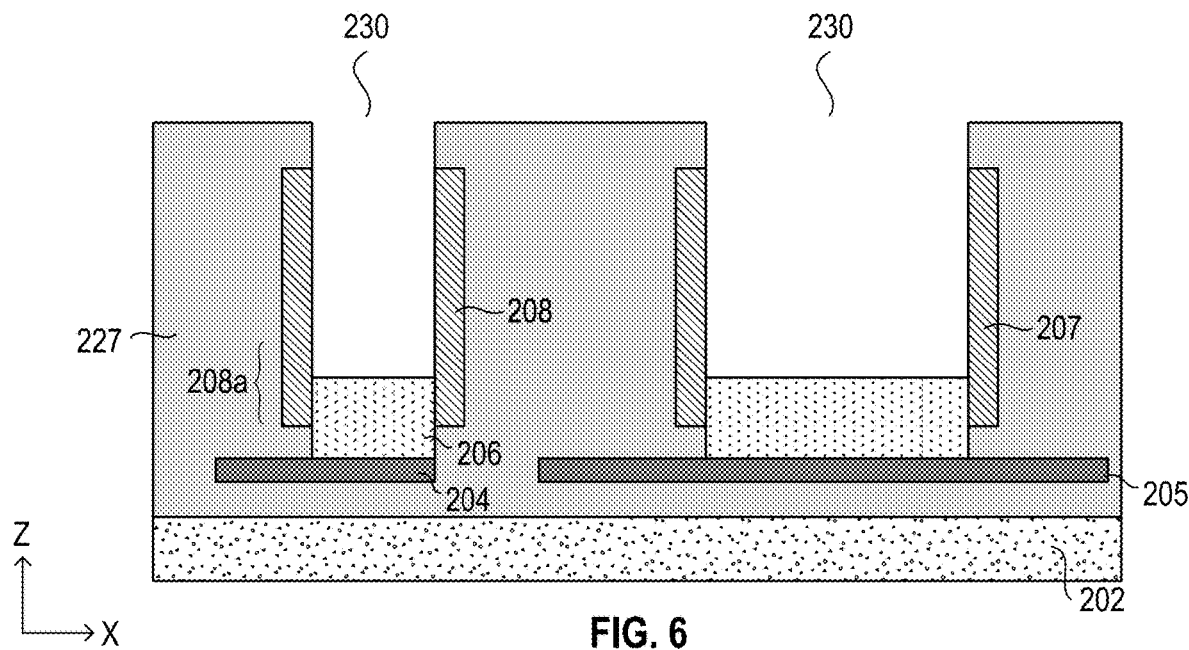

In FIG. 6, the conductive material 232 in the core regions 230 of the semiconductor structures (e.g., 207 and 208) can be etched or recessed to reduce a height of the conductive material 232 sufficiently so that only first S/D regions (e.g., 208a) of the semiconductor structures (e.g., 207 and 208) are connected. Accordingly, the remaining of the conductive material 232 in the core regions of the semiconductor structures becomes the first S/D interconnect structures (e.g., 206).

Figure 7:
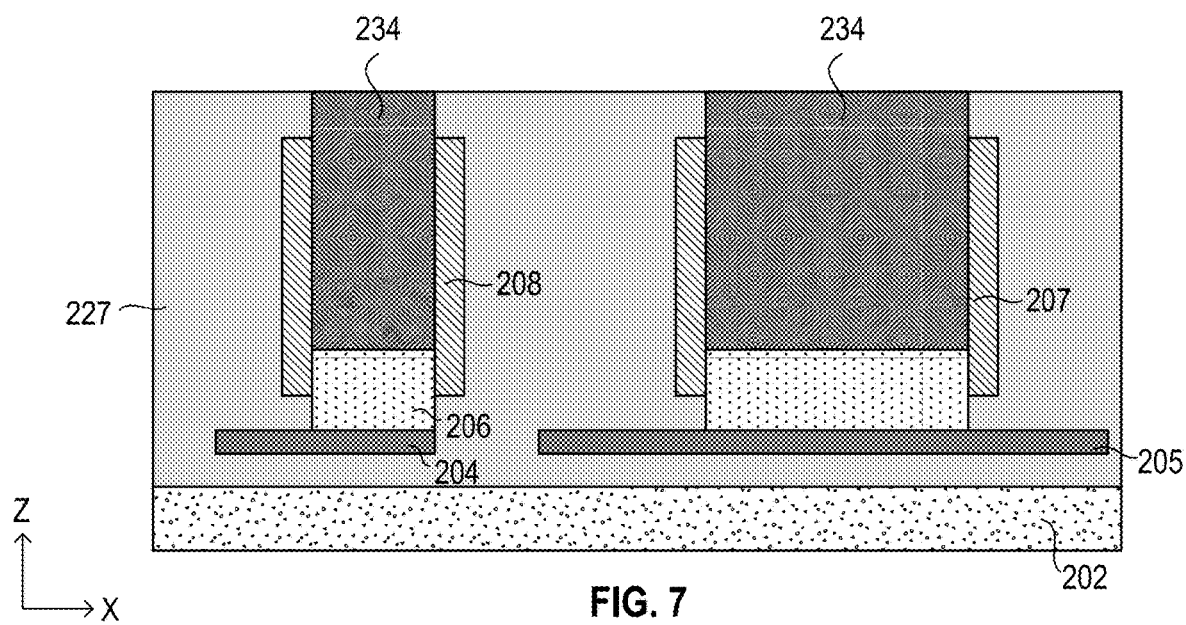

In FIG. 7, a dielectric material 234 can be deposited in the core regions of the semiconductor structures and any overburden of the dielectric material 234 can be removed to isolate the first S/D interconnect structures (e.g., 206) from other transistor elements that can be formed in subsequent steps.

Figure 8:
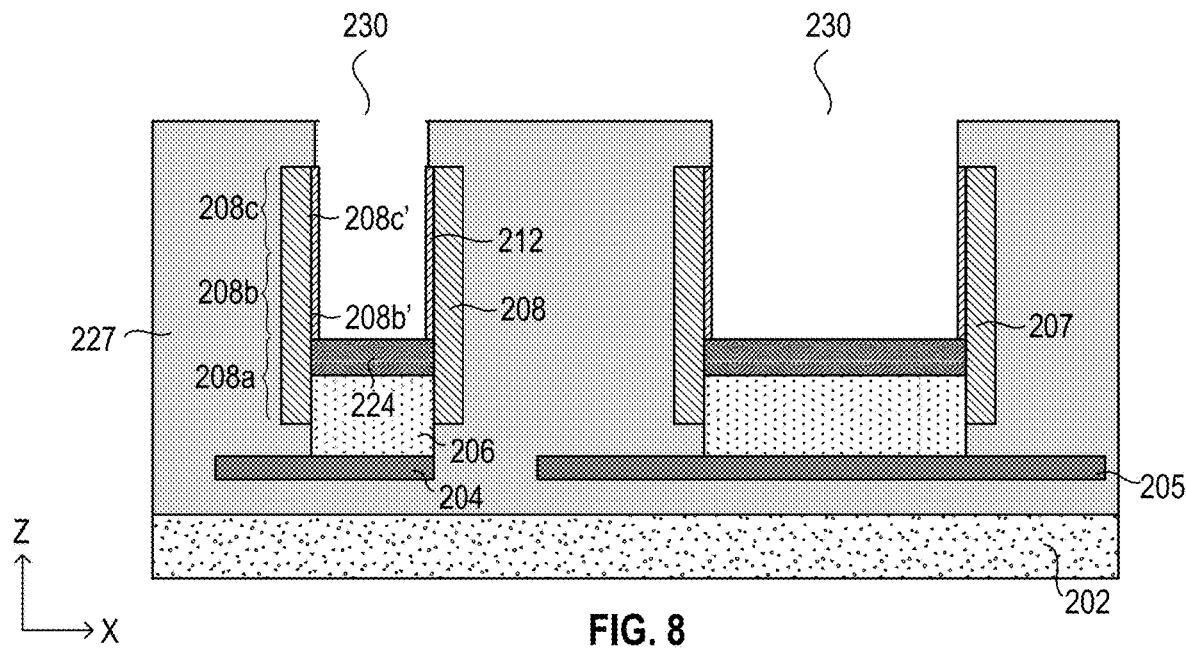

In FIG. 8, the dielectric material 234 can be recessed by an etching process to form the first dielectric layer 224. Further, a high-k gate dielectric deposition can be performed by a selective deposition along the inner surfaces (e.g., 208b' and 208c') of the gate regions and the second S/D regions of the semiconductor structures (e.g., 208) and over the first dielectric layer 224. When the high-k gate dielectric deposition is completed, the gate oxide 212 can be formed accordingly along inner surfaces (e.g., 208b' and 208c') of the gate regions (e.g., 208b) and the second S/D regions (e.g., 208c) of semiconductor structures, and further over the first dielectric layer 224.

Figure 9:
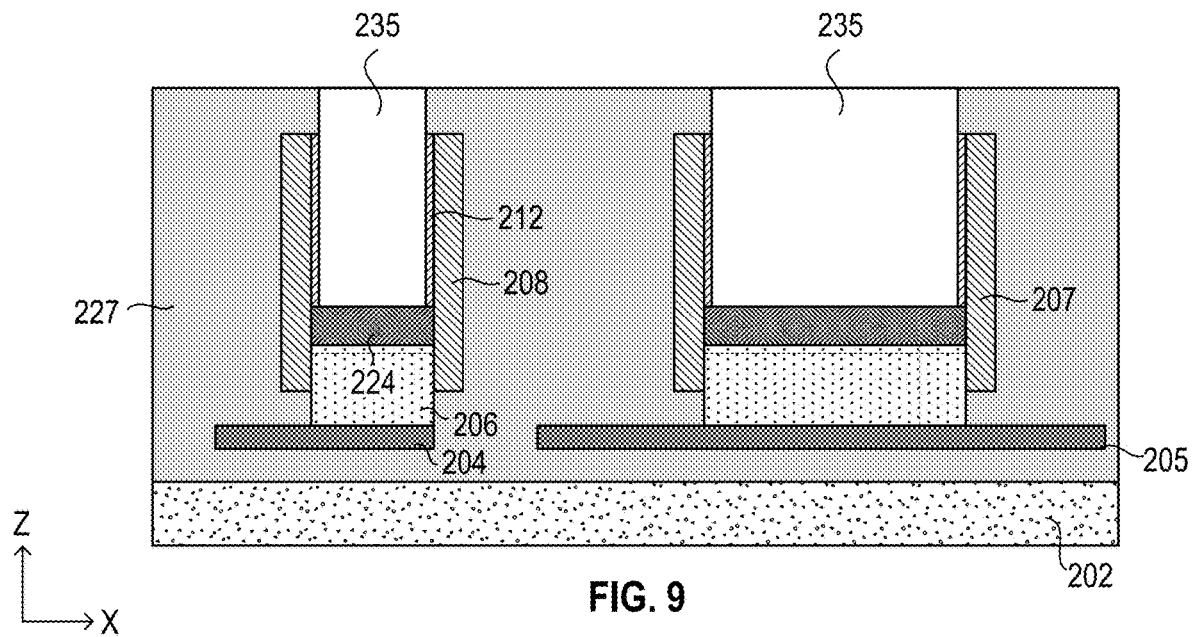

In FIG. 9, a metal gate electrode 235 can be formed in the core regions 230 of the semiconductor structures. The metal gate electrode 235 can be formed along sidewalls of the gate oxide 212 and over the first dielectric layer 224. The metal gate electrode 235 can include one or more barrier layers formed along the sidewalls of the gate oxide 212 and over the first dielectric layer 224, one or more work function layers formed over the one or more barrier layers, and a gate filler formed over the one or more work function layers. The barrier layers can include TiN, TaN, or the like. The work function layers can include AlTiC, AlTiO, AlTiN, TiON, TiC, the like, or the combination thereof. The gate filler can include W, Ru, Co, or the like. Further, any overburden of the metal gate electrode 235 on the dielectric structure 227 can be removed by a CMP process.

Figure 10:
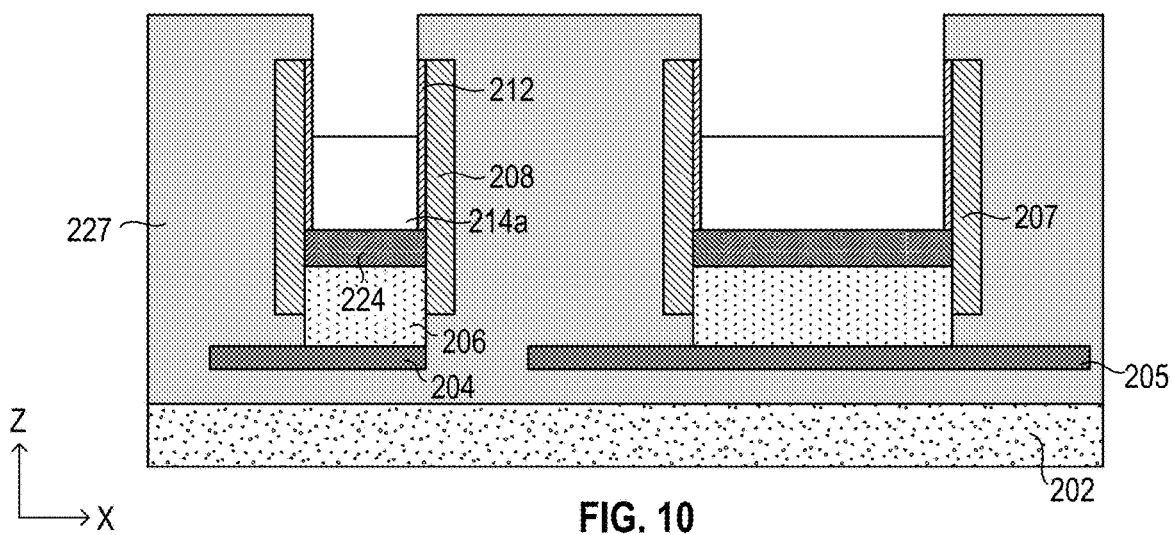

In FIG. 10, the metal gate electrode 235 can be etched and recessed to define a gate electrode vertical length. The remaining metal gate electrode 235 after the etching process can become the first portions (e.g., 214a) of the gate electrodes (e.g., 214).

Figure 11:
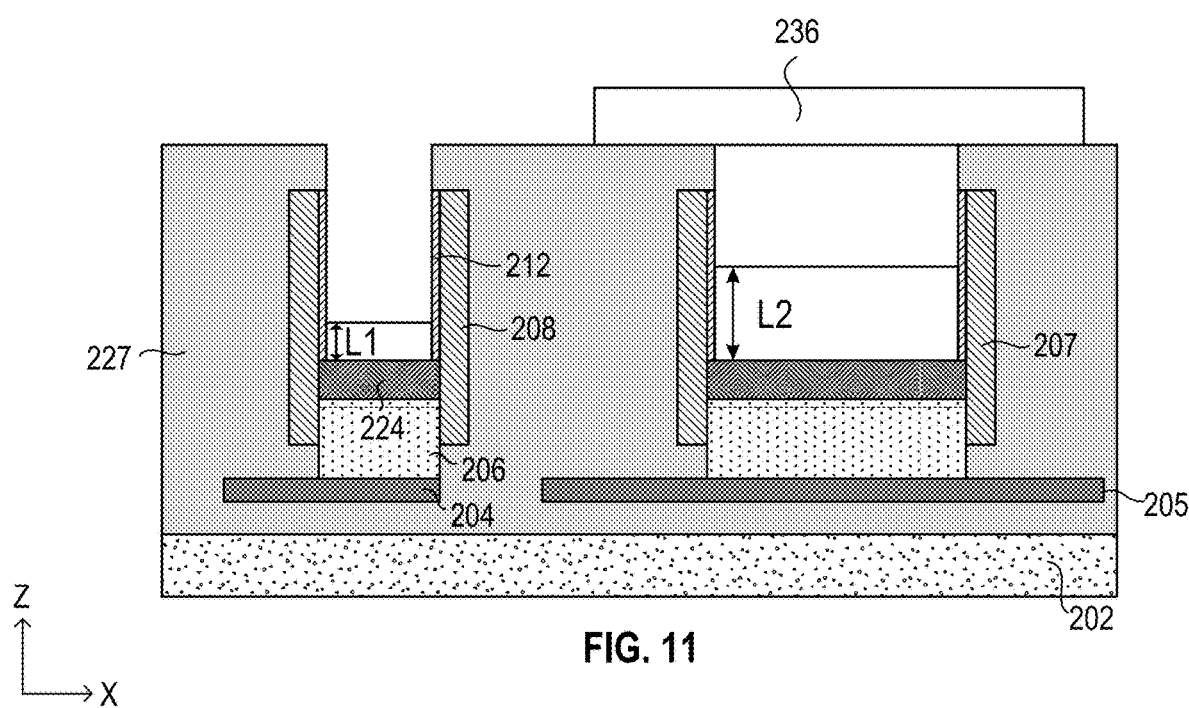

FIG. 11 shows an exemplary way to obtain different gate electrode vertical lengths in the core regions of the semiconductor structures, where a mask can be applied to a portion of core structures while uncovering other core structures. As shown in FIG. 11, a mask 236 can be applied to cover the core region of the semiconductor structure 207 and uncover the core region of the semiconductor structure 208. Accordingly, an etching process can be applied to etch the metal gate electrode 235 more in the core region of the semiconductor structure 208, which results in different sizes of the gate electrode lengths (L) for the vertical transistors. For example, the gate electrode in the core region of the semiconductor structure 208 can have a height of L1, and the gate electrode in the core region of the semiconductor structure 207 can have a height of L2. The L2 is larger than L1. By introducing different sizes of the gate electrode lengths (L) for the vertical transistors, the channel mobility in different vertical transistors (e.g., a n-type vertical transistor and a p-type vertical transistor) can be balanced or modified.

Figure 12:
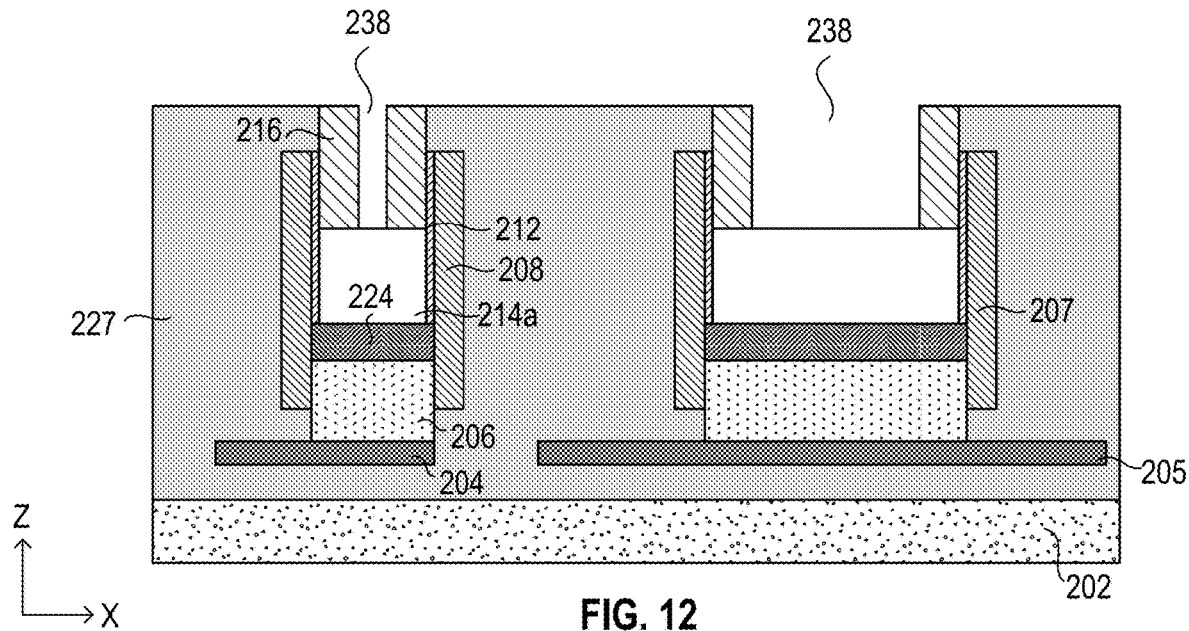

In FIG. 12, sidewall spacers (or second dielectric layers) 216, can be formed over the first portions (e.g., 214a) of the gate electrodes (e.g., 214) and in the core regions of the semiconductor structures. The second dielectric layers can be made of a dielectric material that has a high etch selectivity to other dielectrics (e.g., the dielectric structure 227 and the first dielectric layer 224). The sidewall spacers (or second dielectric layers) 216 can be formed by any suitable deposition process, and an etched back can be performed subsequently to form openings 238 in the sidewall spacers to uncover the first portions (e.g., 214a) of the gate electrodes (e.g., 214).

Figure 13:
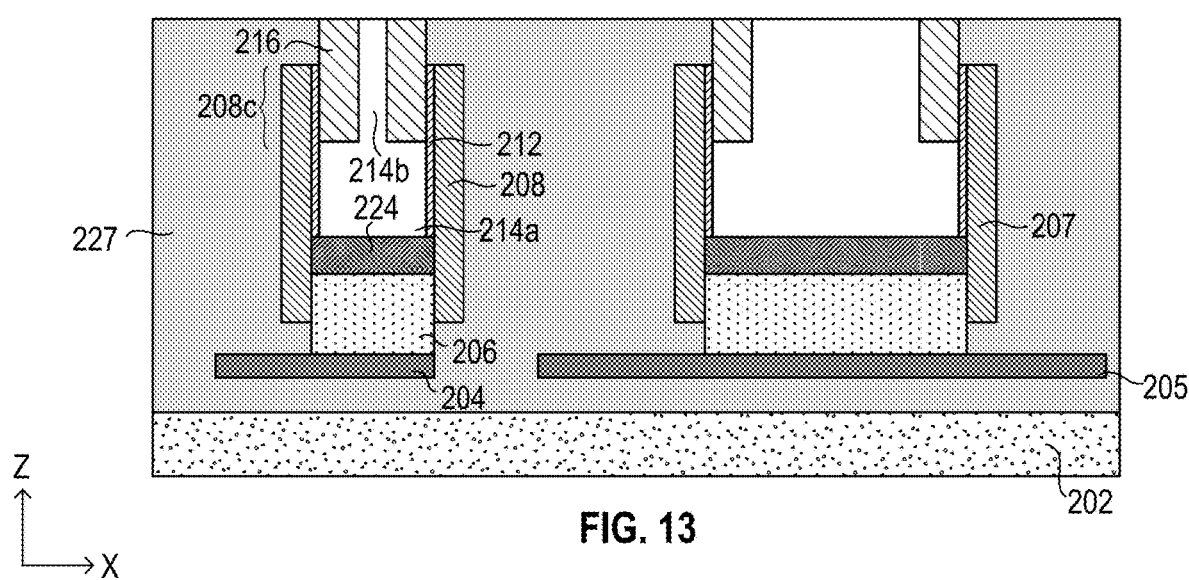

In FIG. 13, a conductive material can be deposited to fill the openings 238 in the second dielectric layers 216. The conductive material remaining in the openings 238 can become the second portions (e.g., 214b) of the gate electrodes (e.g., 214). The second portions (e.g., 214b) of the gate electrodes can provide a gate electrode hookup capability to connect the structures over the vertical transistors in the center of the core regions. The sidewall spacers (or the second dielectric layers) 216 can isolate the second S/D regions (e.g., 208c) from the gate electrodes (e.g., 214b).

Figure 14:
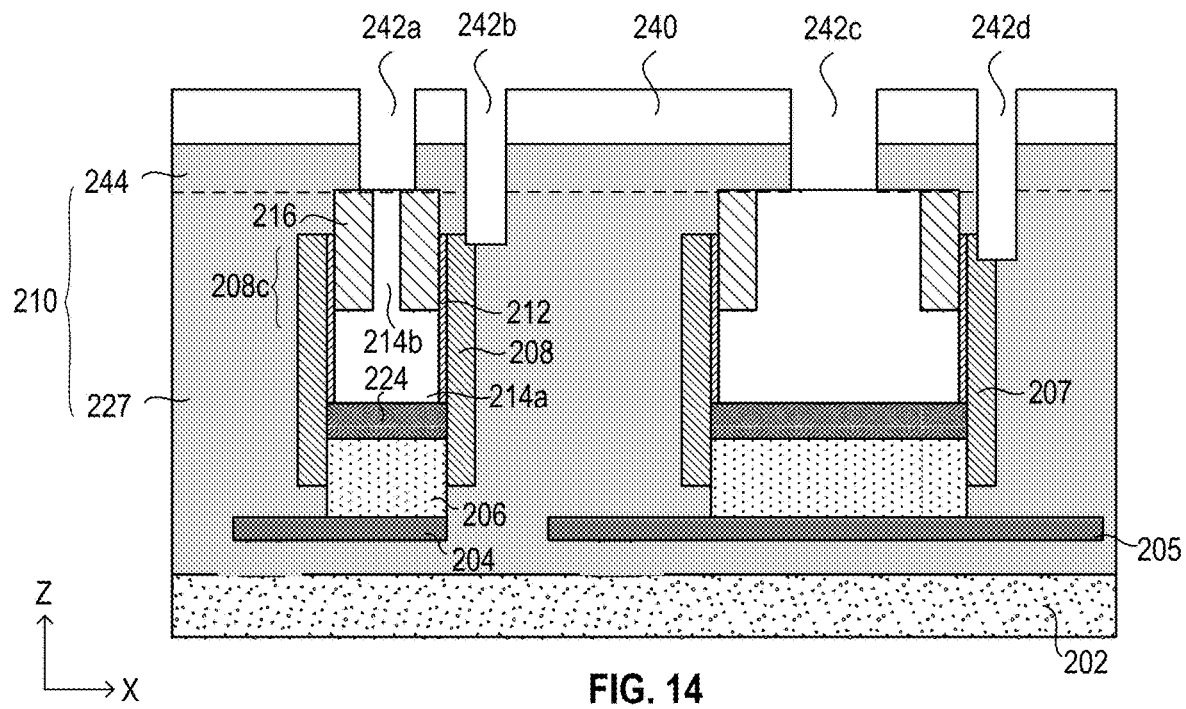

In FIG. 14, a dielectric layer 244 can be formed over the dielectric structure 227 to form the dielectric structure 210 which can be identical to the dielectric structure 210 in FIG. 1A. Further, an etch mask 240 can be formed and an etching process can be performed to form a plurality of contact openings 242 based on patterns of the etch mask 240. The contact openings 242 can define the metal connections. For example, the contact opening 242a can uncover the second portion 214b of the gate electrode 214, and the contact opening 242b can uncover the second S/D region 208c.

Figure 15:
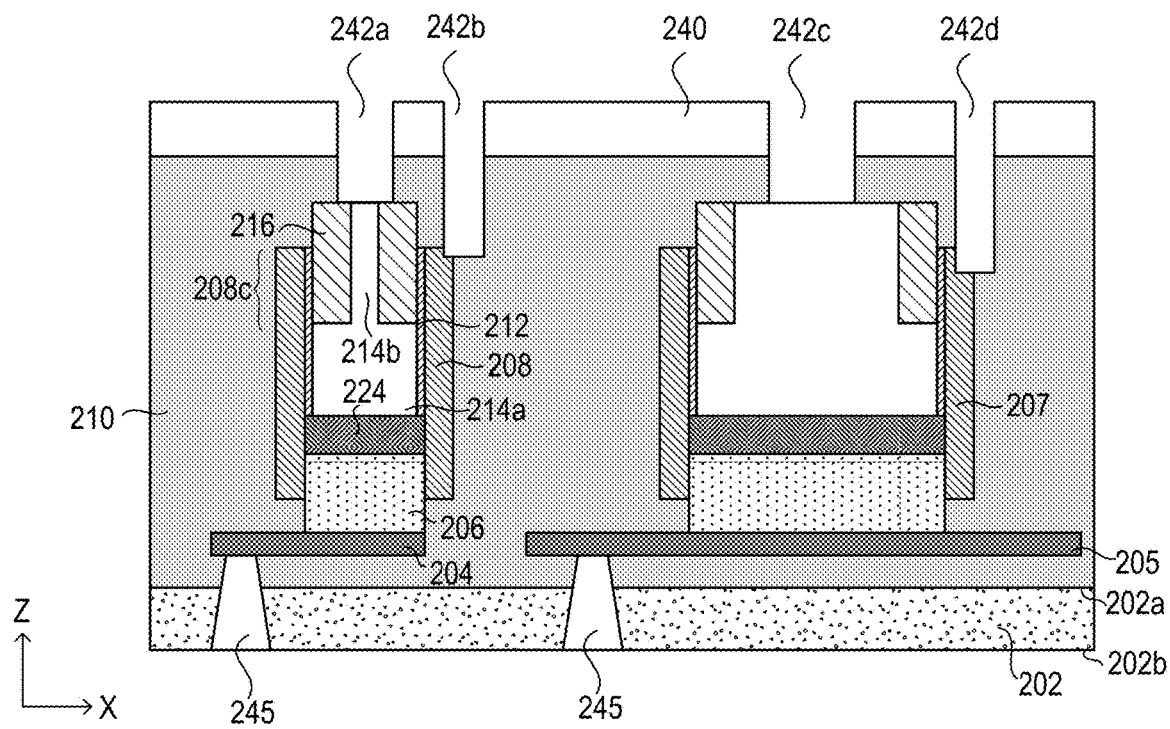

FIG. 15 shows a backside connection to the BPRs (e.g., 204). As shown in FIG. 15, the substrate 202 can be etched from the bottom surface 202b to form backside contact openings 245. The backside contact openings 245 can extend through the substrate 202 from the bottom surface 202b to uncover the BPRs (e.g., 204 and 205). In order to form the backside contact openings 245, the substrate 202 can be flipped such that the bottom surface 202a can receive an etching process. In another example, the substrate 202 may not be flipped, and the etching process can generate etching plasma that is positioned under the substrate 202 and etch the substrate 202 from the bottom surface 202b.

Figure 16:
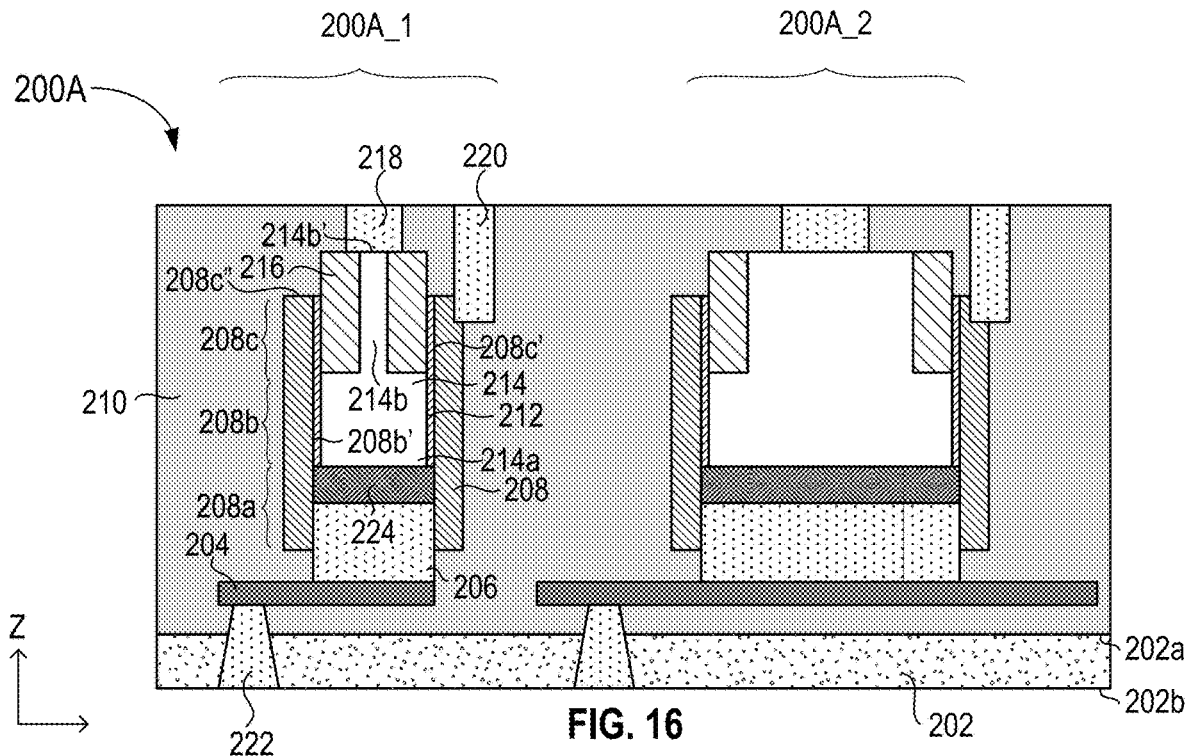
Figure 17:
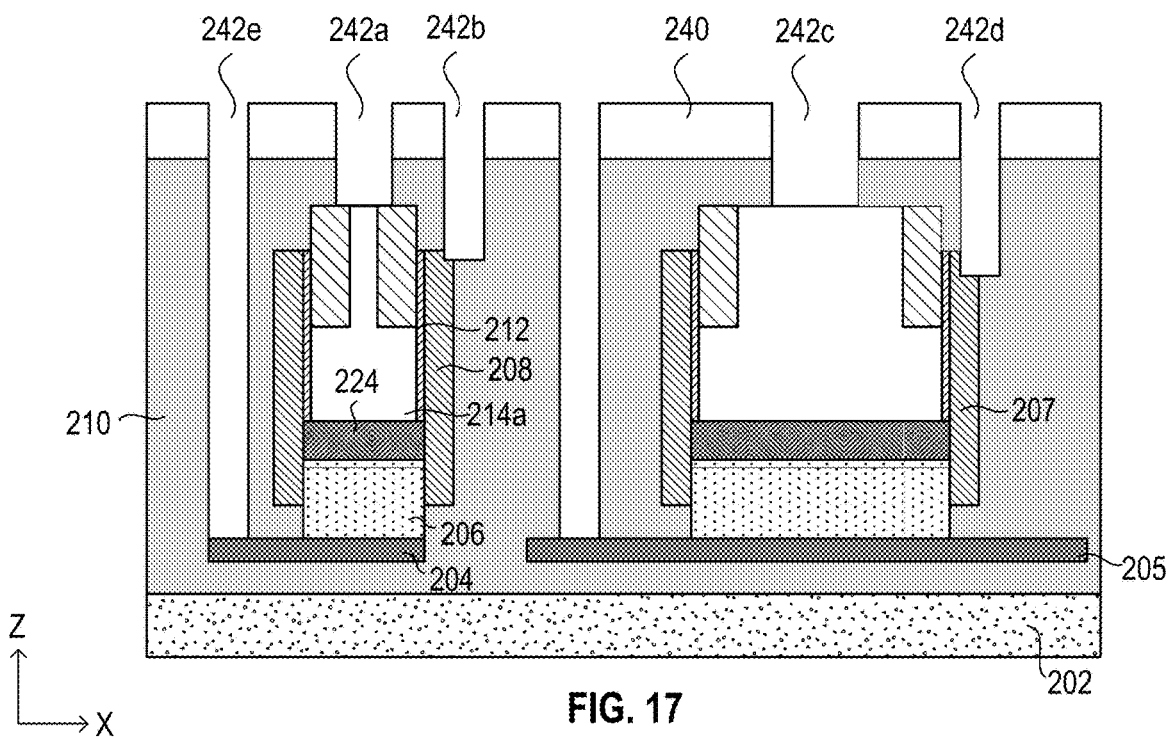

In FIG. 16, a conductive material, such as W, Co, or Ru, can be deposited to fill the contact openings 242 to form the second S/D interconnect structures (e.g., 220) and the gate interconnect contacts (e.g., 218). For example, the second S/D interconnect structure 220 can be formed over and coupled to the second S/D region 208c, and the gate interconnect contact 218 can be positioned over and coupled to the second portion 214b of the gate electrode 214. In addition, the backside contact opening 245 can also be filled with the conductive material to form the S/D contacts 222 that is in contact with the BPRs (e.g., 204 and 205). The first S/D interconnect structures (e.g., 206) can thus be coupled to the S/D contact 222 through the BPRs (e.g., 204). When the second S/D interconnect structures, the gate interconnect contacts, and the S/D contacts are formed, a semiconductor device 200A is accordingly formed. The semiconductor device 200A can be identical to the semiconductor device 200A in FIG. 1A. For example, the semiconductor device 200A can include one or more vertical transistors (e.g., 200A_1 and 200A_2) that are formed over the substrate 202. Each of the vertical transistors can include a tube-shaped semiconductor structure (e.g., 208) extending over the substrate. A gate oxide (e.g., 212) can be formed along the inner surface (e.g., 208b' and 208c') of the semiconductor structure and a gate electrode (e.g., 214) can be formed along sidewalls of the gate oxide.

FIGS. 3-14, and 17-18 are cross-sectional views of various intermediate steps in a process flow to fabricate the second semiconductor device 200B, where a top connection for the second S/D region is applied. When the process flow complete the process in FIG. 14 as discussed before, the process flow proceeds to FIG. 17, where the contact openings can further extend through the dielectric structure 210 to uncover the BPRs (e.g., 204 and 205). For example, the contact opening 242e can be formed based on the etch mask 240 to uncover the BPR 204.

Figure 18:
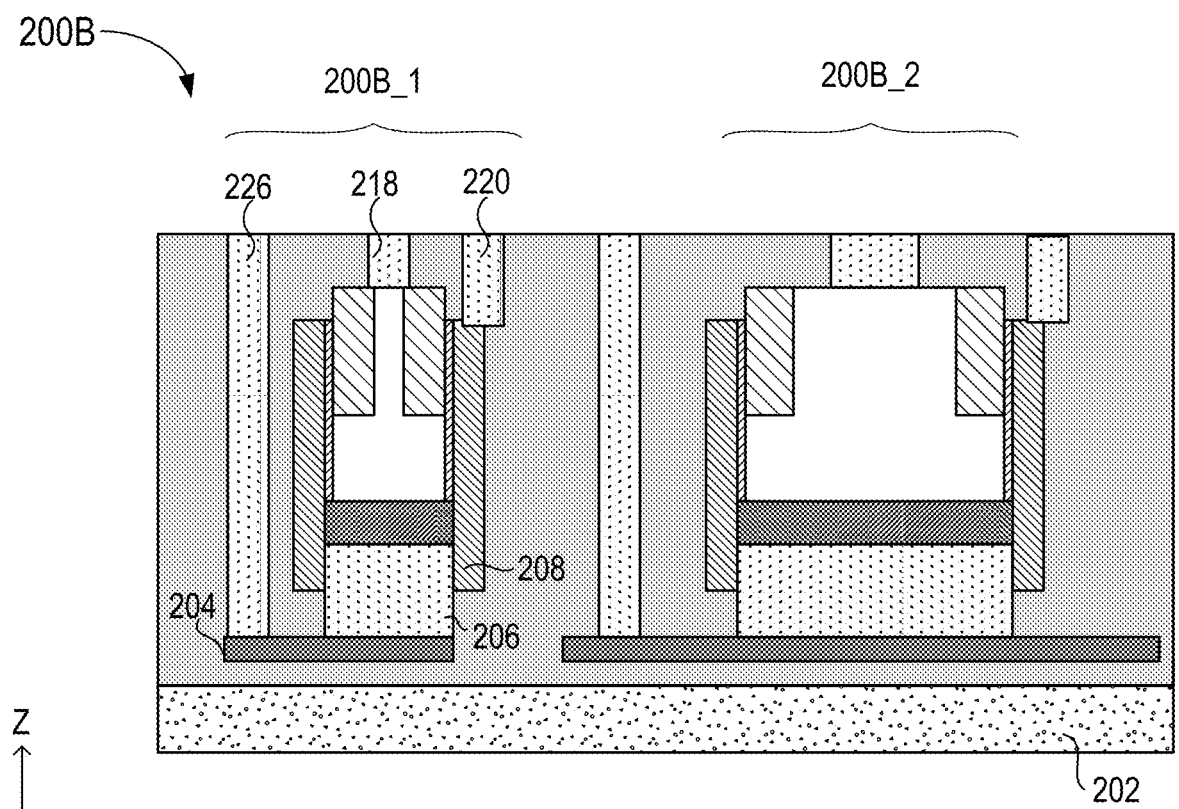

In FIG. 18, the conductive material can further fill the contact openings 242. Accordingly, a S/D contact 226 can be formed. The S/D contact 226 can be positioned adjacent to the semiconductor structure 208 and extend from the BPR 204 in the vertical direction (e.g., Z direction) such that the first S/D interconnect structure 206 can be coupled to the S/D contact 226 through the BPR 204. When the second S/D interconnect structures, the gate interconnect contacts, and the S/D contacts (e.g., 226) are formed, a semiconductor device 200B can be accordingly formed. The semiconductor device 200B can be identical to the semiconductor device 200B in FIG. 1B.

Figure 19A:
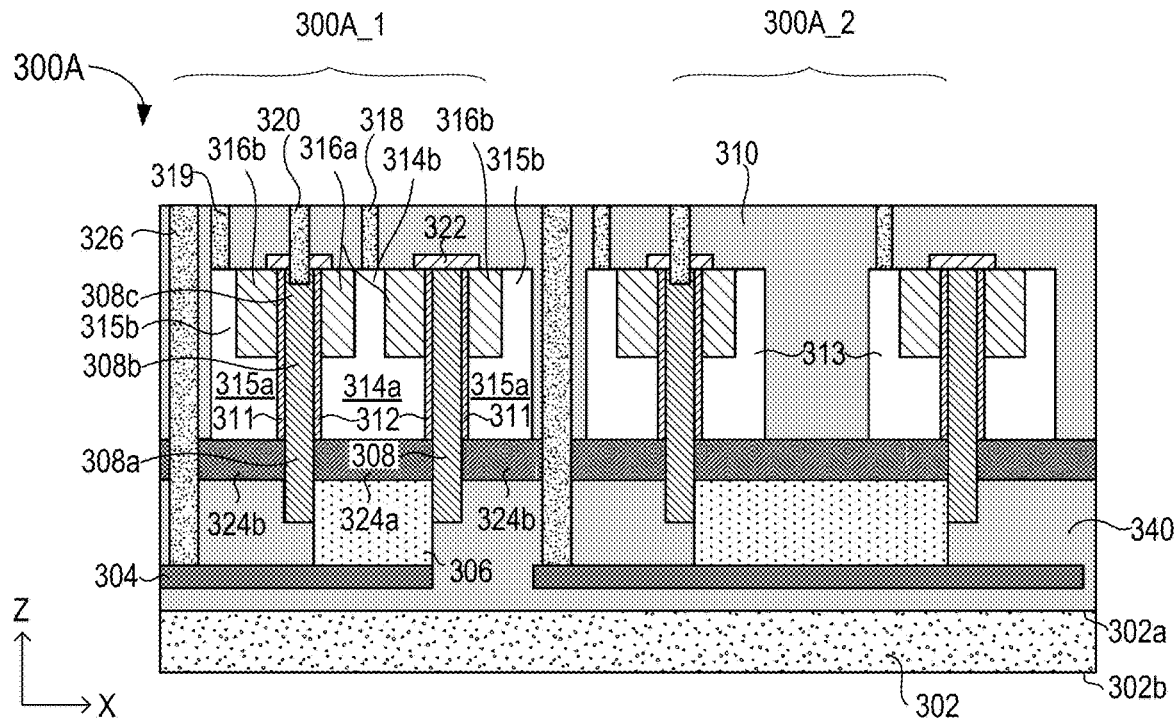
FIG. 19A is a cross-sectional view of a third exemplary vertical transistor, in accordance with some embodiments.

FIG. 19A shows a cross-sectional view of first exemplary semiconductor device 300A that are formed based on the second process flow. As shown in FIG. 19A, the first semiconductor device 300A can include a first transistor 300A_1 and a second transistor 300A_2 that are formed over a substrate 302. The first transistor 300A_1 and the second transistor 300A_2 can have different dimensions but similar structures. For simplicity and clarity, the structures of the first transistor 300A_1 and the second transistor 300A_2 can be discussed based on the first transistor 300A_1.

Still referring to FIG. 19A, the first transistor 300A_1 can include a BPR 304 formed over a top surface 302a of a substrate 302, where the substrate 302 can include an opposing bottom surface 302b. The first transistor 300A_1 can include a semiconductor structure 308 formed over the BPR 304. The semiconductor structure 304 can be tube-shaped and extend along a vertical direction (e.g., Z direction) perpendicular to the substrate 302. The first transistor 300A_1 can further include a first S/D region 308a over the BPR 304, a gate region 308b over the first S/D region 308a, and a second S/D region 308c over the gate region 308b. The first transistor 300A_1 can include a first S/D interconnect structure 306 extending from the BPR 304 and further into the first transistor 300A_1 such that a top portion of the first S/D interconnect structure 306 is surrounded by the first S/D region 308a of the first transistor 300A_1. The first transistor 300A_1 can also include a first gate oxide 312 formed along an inner surface of the gate region 308b and an inner surface of the second S/D region 308c, and a second gate oxide 311 formed along an outer surface of the gate region 308b and an outer surface of the second S/D region 308c to surround the gate region 308b and the second S/D region 308c. The first transistor 300A_1 can further include a first gate electrode 314 formed along sidewalls of the first gate oxide 312 in the gate region 308b such that the first gate electrode 314 is surrounded by the gate region 308b, and a second gate electrode 315 formed along sidewalls of the second gate oxide 311 to surround the gate region 308b. The first transistor 300A_1 can include a second S/D interconnect structure 320 positioned over and coupled to the second S/D region 308c.

In some embodiments, a cross-section of the semiconductor structure 308 obtained along a direction parallel (e.g., X direction) to the substrate 302 can include one of a circular ring shape, a square ring shape, a rectangular ring shape, and an oval ring shape.

The first transistor 300A_1 can also include a first dielectric layer 324. The first dielectric layer 324 can include (i) a first portion 324a positioned between the first S/D interconnect structure 306 and the first gate electrode 314 and surrounded by the first S/D region 308a, and (ii) a second portion 324b formed along an outer surface of the first S/D region 308a so as to surround the first S/D region 308a. The first transistor 300A_1 can also include a first gate interconnect contact 318 positioned over and coupled to the first gate electrode 314, and a second gate interconnect contact 319 positioned over and coupled to the second gate electrode 315.

In some embodiments, the first gate electrode 314 can include a first portion 314a arranged along the sidewalls of the first gate oxide 312 in the gate region 308b and a second portion 314b that is in contact with the first gate interconnect contact 318. The second portion 314b can extend from the first portion 314a of the first gate electrode 314 and through the second S/D region 308c such that a top surface of the second portion 314b of the first gate electrode 314 is substantially level with a top surface of the second S/D region 308c. The second gate electrode 315 can include a first portion 315a arrange along the sidewalls of the second gate oxide 311 in the gate region 308b and a second portion 315b that is in contact with the second gate interconnect contact 319. The second portion 315b can extend from the first portion 315a of the second gate electrode 315 in the vertical direction such that a top surface of the second portion 315b of the second gate electrode 315 is substantially level with the top surface of the second S/D region 308c.

The first transistor 300A_1 can include a second dielectric layer 316. The second dielectric layer 316 can include a first portion 316a positioned over the first portion 314a of the first gate electrode 314 and surrounding the second portion 314b of the first gate electrode 314, where the first portion 316a of the second dielectric layer 316 can be positioned between the first gate oxide 312 in the second S/D region 308c and the second portion 314b of the first gate electrode 314. The second dielectric layer 316 can also include a second portion 316b positioned over the first portion 315a of the second gate electrode 315 and surrounded by the second portion 315b of the second gate electrode 315. The second portion 316b of the second dielectric layer 316 can further be positioned between the second portion 315b of the second gate electrode 315 and the second gate oxide 311 in the second S/D region 308c.

In an embodiment, the first transistor 300A_1 can include a S/D contact 326 positioned adjacent to second gate electrode 315 and extending from the BPR 304 in the vertical direction such that the first S/D interconnect structure 306 is coupled to the S/D contact 326 through the BPR 304.

The first semiconductor device 300A can also include a dielectric structure 340 that is positioned between the BPRs (e.g., 306) and the first dielectric layer 324, and a dielectric structure 310 that is positioned over the first dielectric layer 324. As shown in FIG. 19A, the gate regions (e.g., 308b) and the second S/D regions (e.g., 308c) of the semiconductor structures (e.g., 308), the gate interconnect contacts (e.g., 318), and the second S/D interconnect structures (e.g., 320) can be positioned in the dielectric structure 310. The dielectric structures 310 and 340 can include one or more dielectric layers.

The first transistor 300A_1 can include a cap layer 322 formed on the top surface of the semiconductor structure 308. The cap layer 322 can provide additional breakdown strength for future metal gate electrode connection between inner and outer surfaces of the vertical channel transistors.

It should be noted that in the semiconductor device 300A, the first gate electrode 313 in the second transistor 300A_2 can be a ring shape such that the dielectric structure 310 can extend through the first gate electrode 313.

Figure 19B:
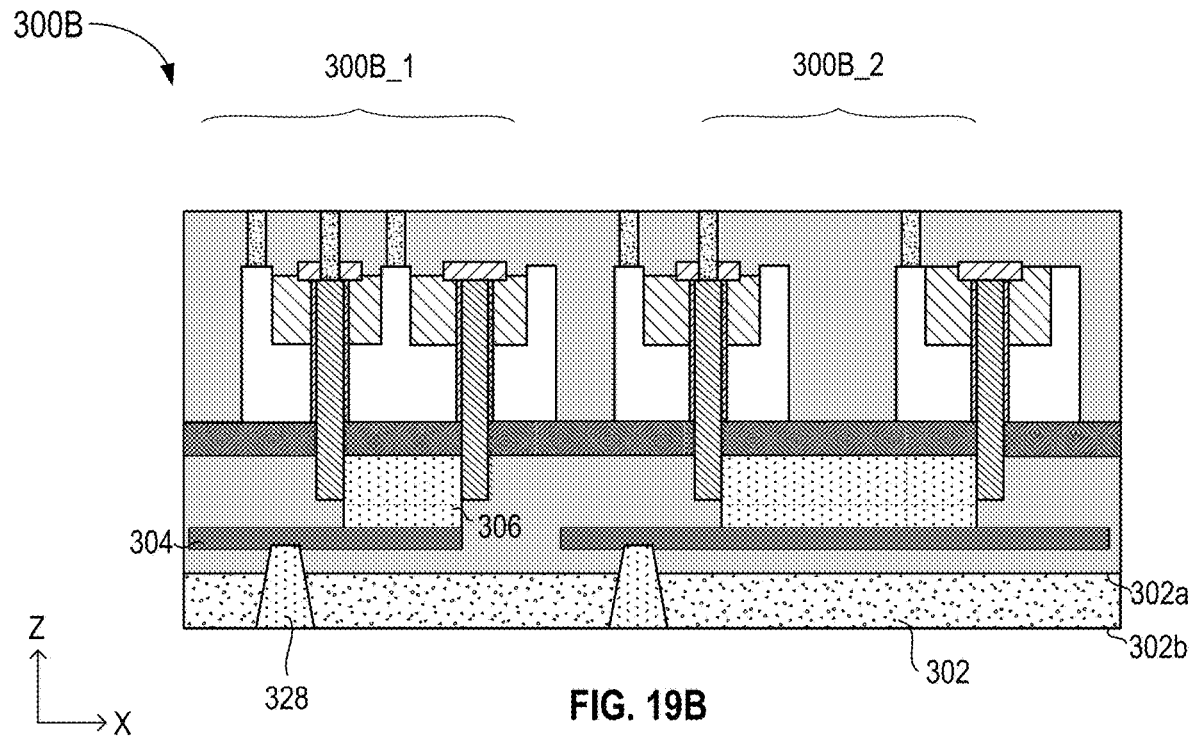
FIG. 19B is a cross-sectional view of a fourth exemplary vertical transistor, in accordance with some embodiments.

FIG. 19B is a cross-sectional view of second exemplary semiconductor device 300B that are formed based on the second process flow. The second semiconductor device 300B can include a first transistor 300B_1 and a second transistor 300B_2 that may have different dimensions. Compared to the first transistor 300A_1 in semiconductor device 300A, the first transistor 300B_1 in semiconductor device 300B can include a S/D contact 328 extending through the substrate 302 from the bottom surface 302b of the substrate 302 to contact the BPR 304, where the first S/D interconnect structure 306 can be coupled to the S/D contact 328 through the BPR 304.

Figure 20:
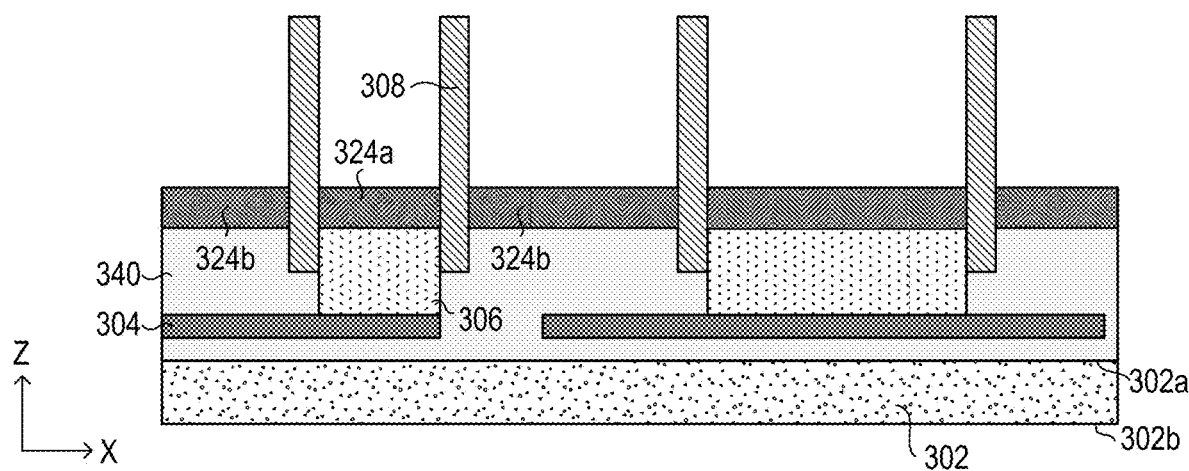

FIGS. 3-6, and 20-31 are cross-sectional views of various intermediate steps in a process flow to fabricate the semiconductor device 300A, in accordance with some embodiments. The process flow can start with FIGS. 3-6, and then proceed to FIG. 20. In FIG. 20, the dielectric structure 227 shown in FIG. 6 can be recessed to form a dielectric structure 340 such that a top surface of the 340 can be level with a top surface of the first S/D interconnect structure 306. Further, the first dielectric layer 324 can be formed that include the first portion 324a and the second portion 324b. In order to form the first dielectric layer 324, a dielectric material can be deposited on the dielectric structure 340, and an etching process can be applied to recess the dielectric material to a desired height. Accordingly, the semiconductor structures (e.g., 308) can protrude from the first dielectric layer 324.

Figure 21:
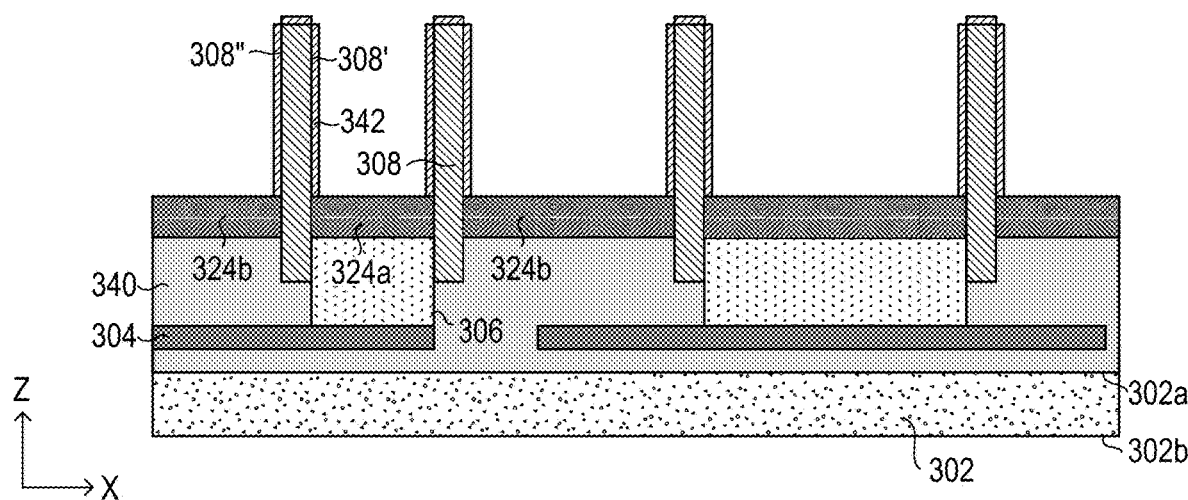

In FIG. 21, a high-k material 342 can be deposited on the shell structures (or the semiconductor structures) by selective deposition. Accordingly, the high-k material 342 can be primarily deposited along the inner surfaces and the outer surfaces of the semiconductor structures. For example, the high-k material can be formed along the inner surface 308' and the outer surface 308" of the semiconductor structure 308 in FIG. 21. It should be noted that the high-k material can also be deposited on the top surfaces of the semiconductor structures.

Figure 22:
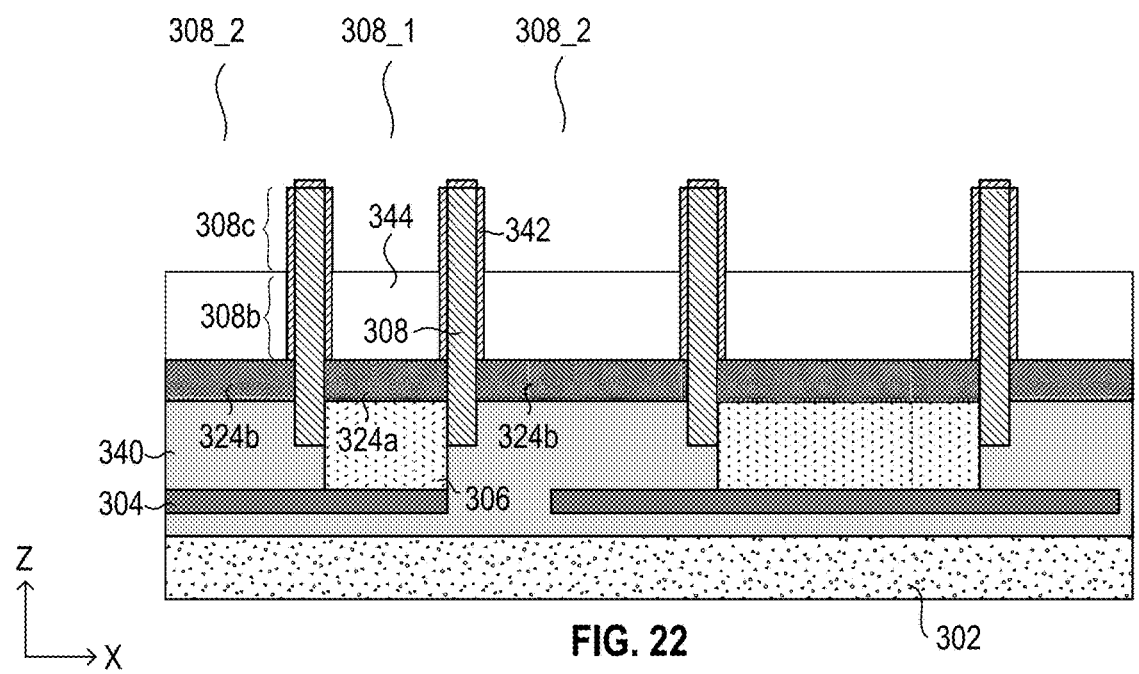

In FIG. 22, a gate electrode metal 344 can be deposited to surround the semiconductor structures. For example, the gate electrode metal 344 can be formed to surround the semiconductor structure 308 such that the gate electrode metal 344 can be positioned both in the core region 308_1 and non-core region 308_2 of the semiconductor structure 308. The gate electrode metal 344 can further be recessed so that the gate electrode metal 344 can be positioned in the gate region 308b, and the second S/D region 308c can protrude from the gate electrode metal 344.

Figure 23:
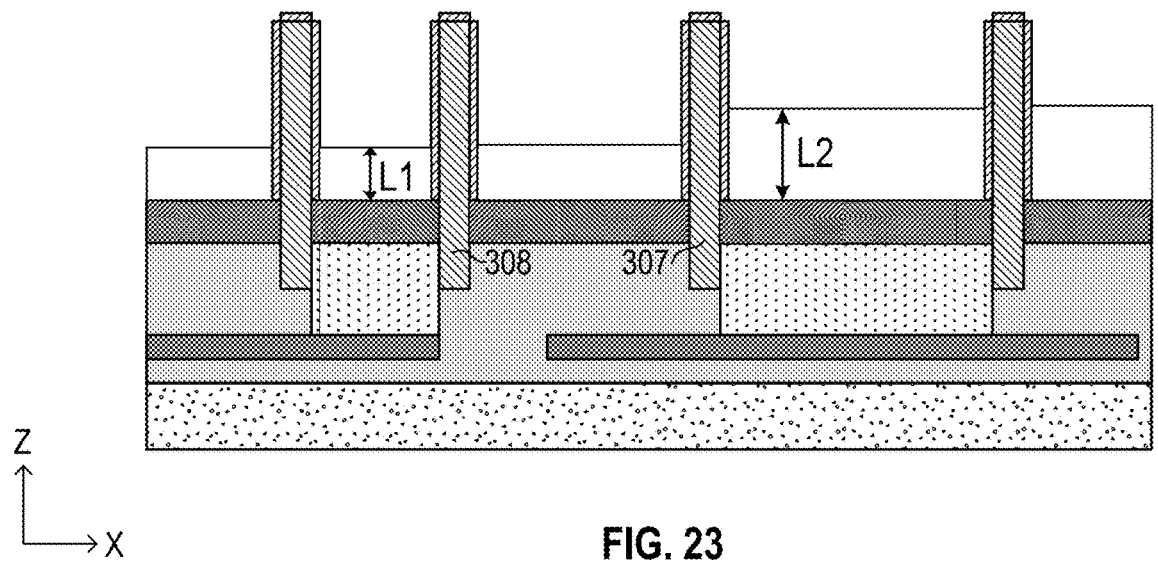

In FIG. 23, an option to mask a portion of the channel shell structures (e.g., the semiconductor structures 307 and 308) is shown to make different lengths of metal gates (or gate electrodes). The different lengths of the metal gates can be used to have one length for PMOS devices and another length for NMOS devices, for example. As shown in FIG. 23, the gate electrode metal that surrounds the semiconductor structure 308 can have a length of L1, and the gate electrode metal that surrounds the semiconductor structure 307 can have a length of L2. The L2 can be larger than the L1.

Figure 24:
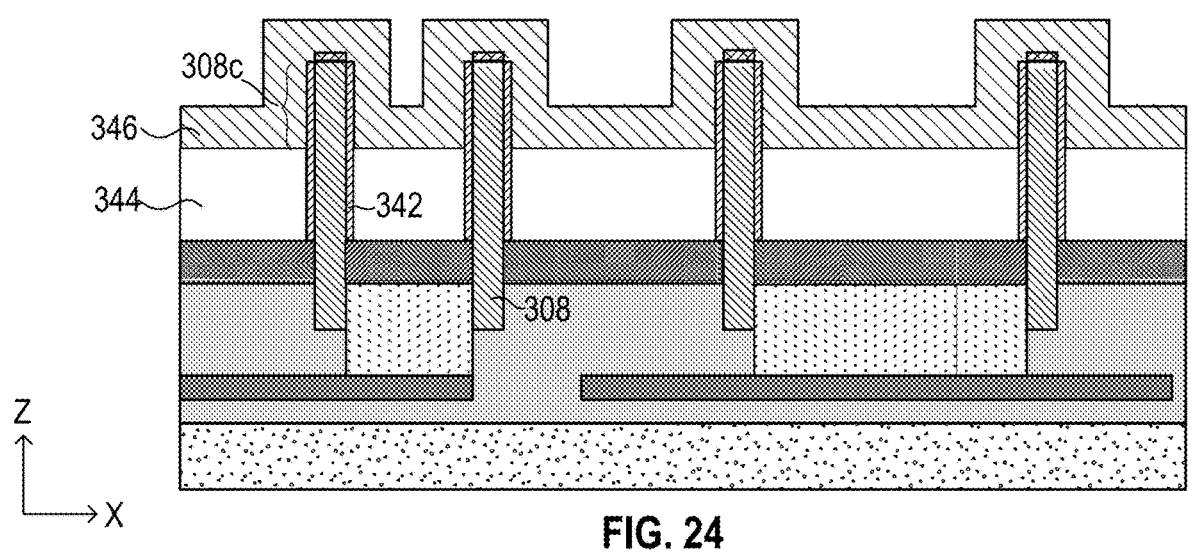

In FIG. 24, a dielectric layer 346 can be deposited over the gate electrode metal 344 and further conformally cover the second S/D regions (e.g., 308c) of the semiconductor structures.

Figure 25:
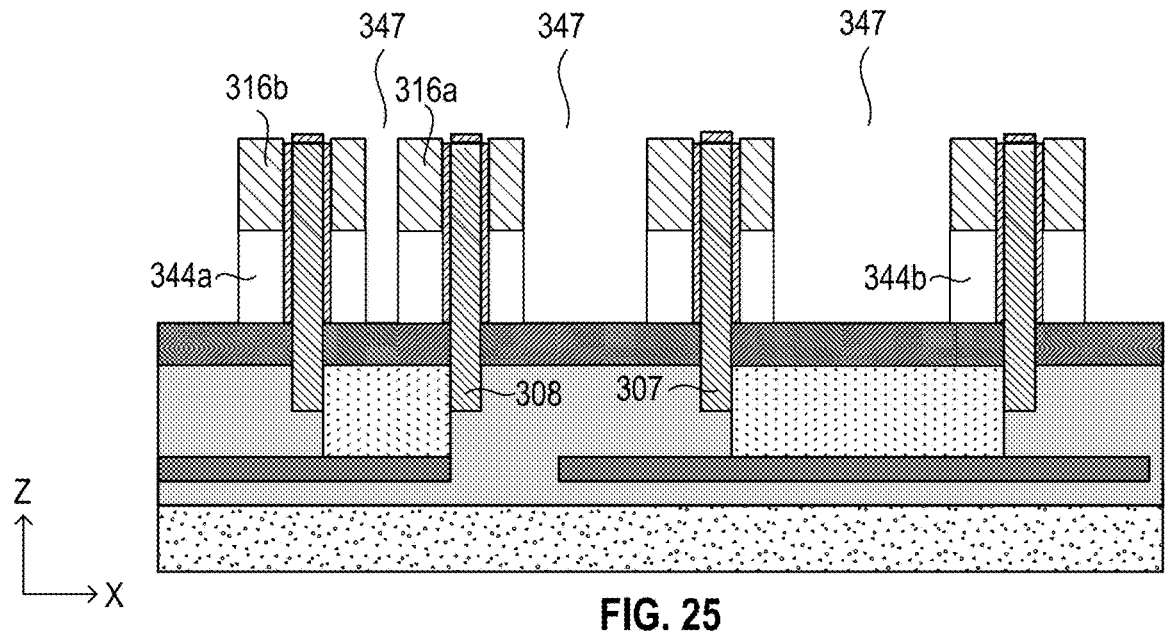

In FIG. 25, a dielectric spacer etch of the dielectric layer 346 can be performed to form spacers (or second dielectric layers) 316. A gate metal etch can subsequently be applied using spacers as an etch mask for the metal gate etch to form a plurality of spaces 347. The spaces 347 can separate the gate electrode metal 344 such that the gate electrode metal 344 can be divided into a first portion 344a to surround the semiconductor structure 308 and a second portion 344b to surround the semiconductor structure 307.

Figure 26:
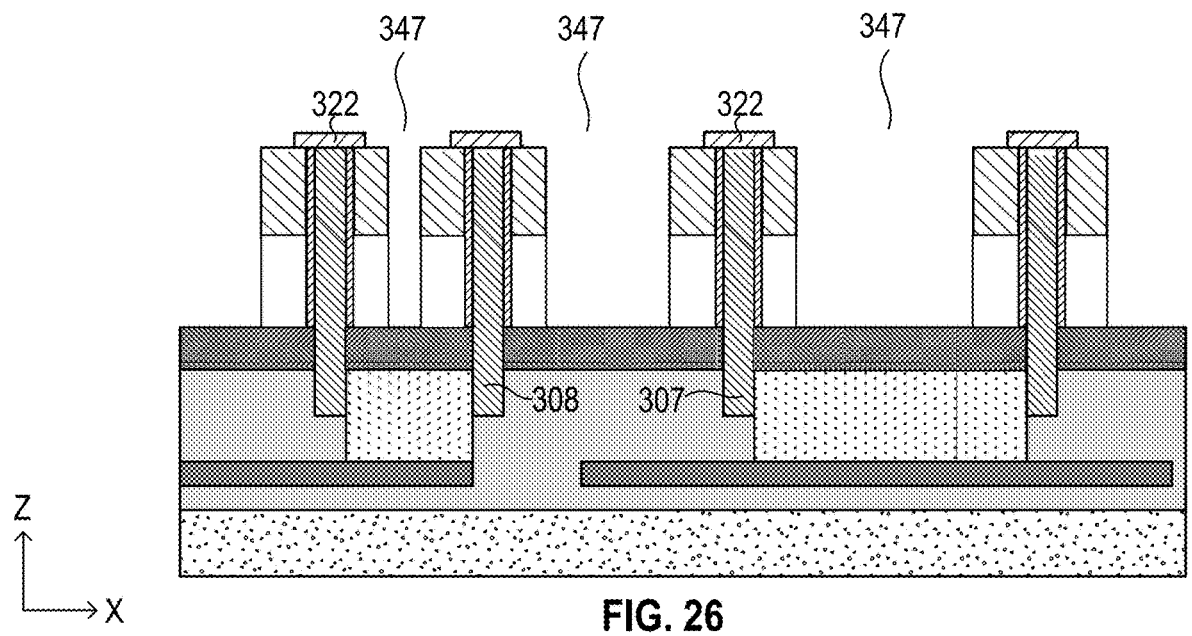

In FIG. 26, the high-k material 342 that is position on the top surfaces of the semiconductor structures can be removed, and cap layers can be formed on the top surface of the semiconductor structures. For example, cap layers 322 can be formed on the top surfaces of the semiconductor structures 307 and 308. The cap layers 322 can provide additional breakdown strength for future metal gate electrode connection between inner and outer surfaces of the vertical channel transistors.

Figure 27:
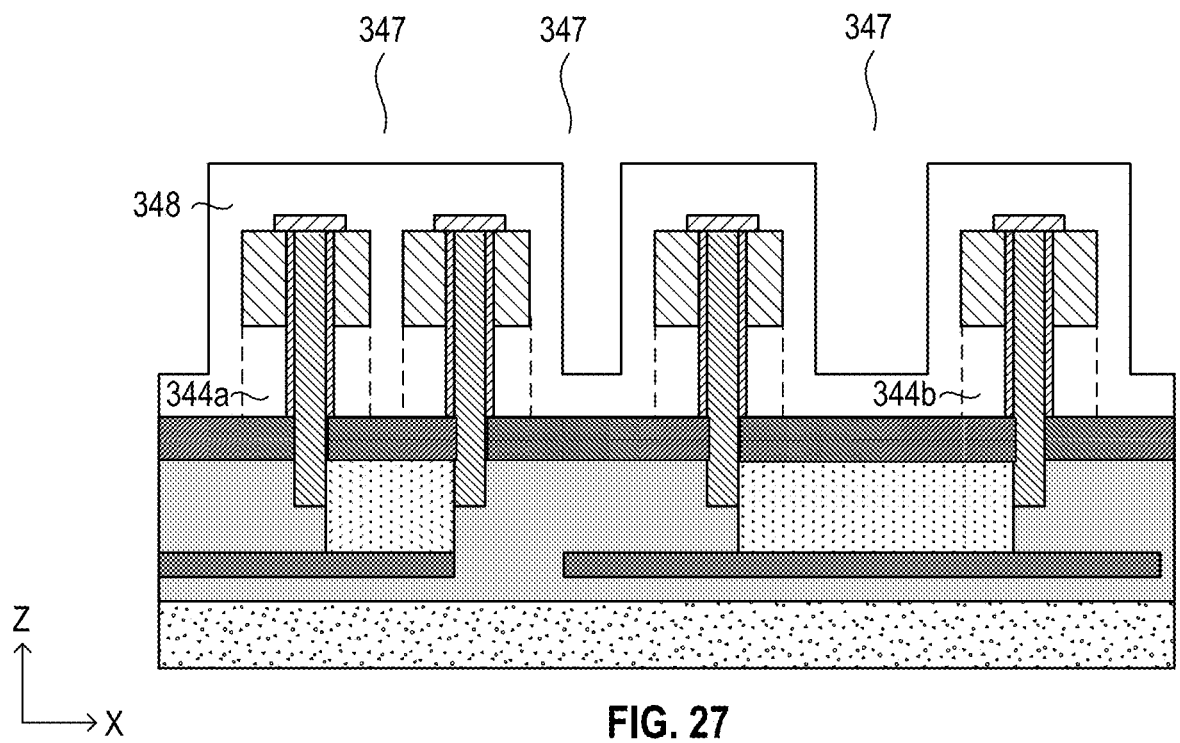

FIG. 27 shows a conformal metal gate deposition that can deposit a gate electrode metal 348 to cover the semiconductor structures (e.g., 307 and 308). The gate electrode metal 348 can be formed over the semiconductor structures and further be filled in the spaces 347. In some embodiments, the gate electrode metal 348 can include a same conductive material as the gate electrode metal 344.

Figure 28:
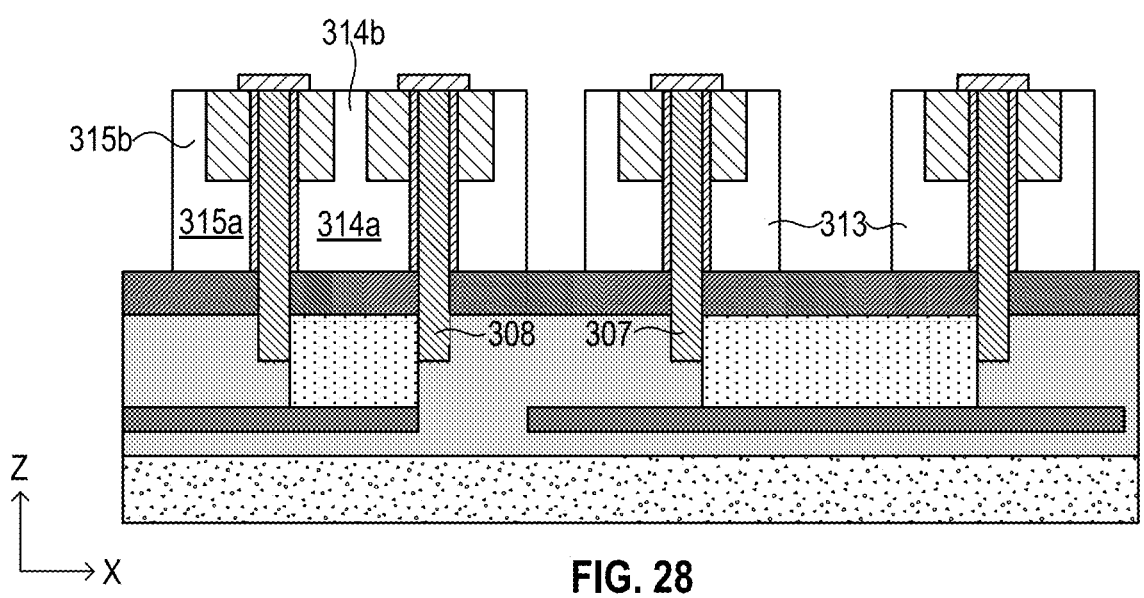

In FIG. 28, a directional etching can be applied to separate the gate electrode metal 348 into a first portion that surrounds the semiconductor structure 308 and a second portion that surrounds the semiconductor structure 307. When the directional etching is completed, the first gate electrode 314 and the second gate electrode 315 can accordingly be formed. As shown in FIG. 28, the first gate electrode 314 can include the first portion 314a and the second portion 314b. The second gate electrode 315 can include the first portion 315a and the second portion 315b. The directional etching can also form the first gate electrode 313 that is positioned along the inner surface of the semiconductor structure 307 and include a ring shape.

Figure 29:
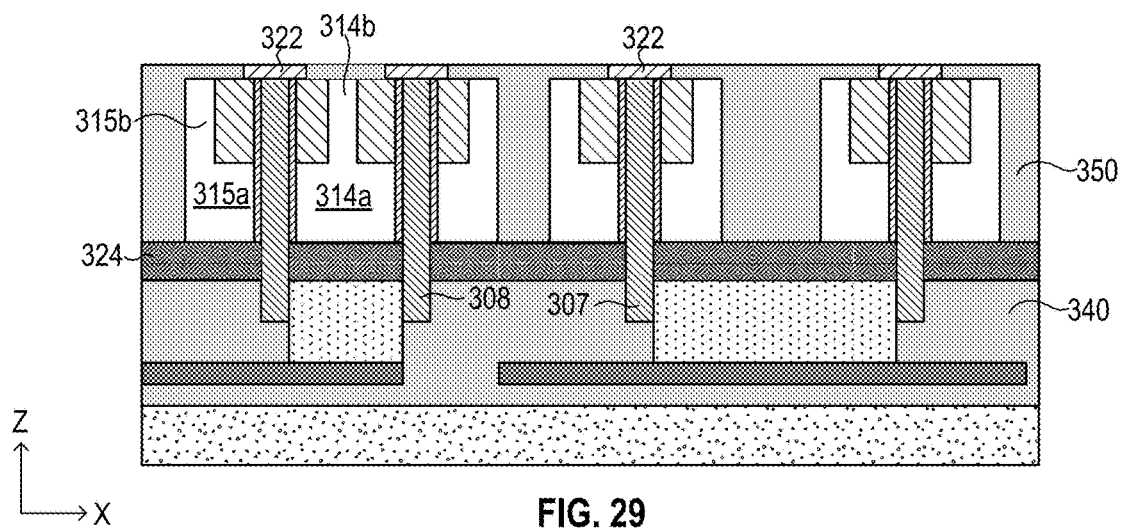

In FIG. 29, a dielectric layer 350 can be deposited over the first dielectric layer 324 and further cover the first gate electrode 314 and the second gate electrode 315. Further, overburden of the deposition can be removed such that a top surface of the dielectric layer 350 can be level with top surfaces of the cap layers 322.

Figure 30:
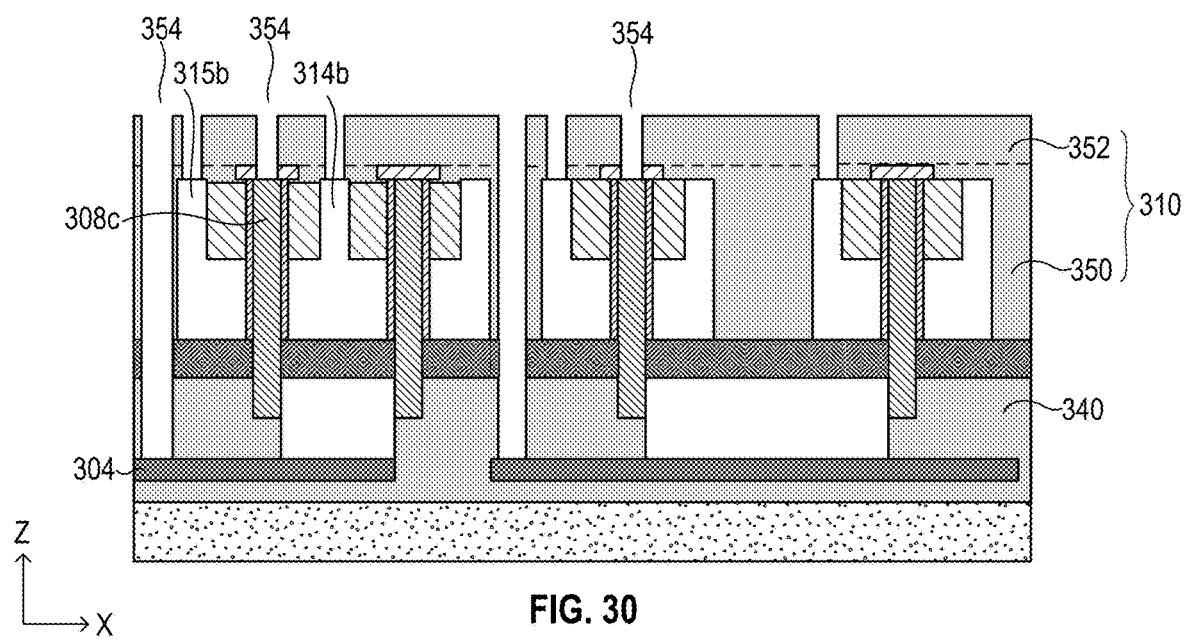

In FIG. 30, a dielectric layer 352 can be formed over the dielectric layer 350. The dielectric layer 352 and the dielectric layer 350 can form the dielectric structure 310 accordingly. Subsequently, an etch mask (not shown) can be formed over the dielectric layer 352, and an etching process can be performed based on the etch mask to form a plurality of contact openings 354. The contact openings 354 can uncover the BPRs (e.g., 304), the first and second gate electrodes (e.g., 314 and 315), and the second S/D regions (e.g., 308c) of the semiconductor structures.

Figure 31:
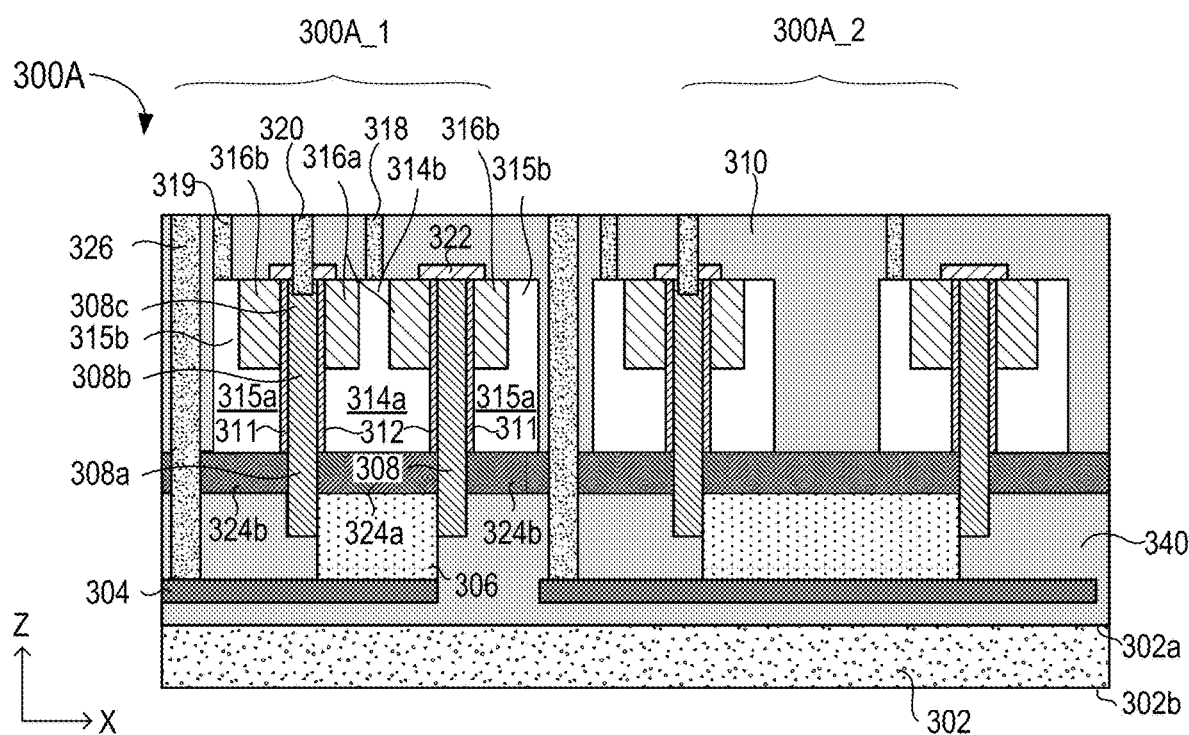

In FIG. 31, a metallization process, such as a plating process or a deposition process, can be performed to fill the contact openings 354 with a conductive material. Accordingly, the S/D contacts (e.g., 326), the first gate interconnect contacts (e.g., 318), the second gate interconnect contacts (e.g., 319), and the second S/D interconnect structures (e.g., 320) can be formed. When the metallization process is completed, a semiconductor device 300A can accordingly be formed. The semiconductor device 300A can have identical features to the semiconductor device 300A in FIG. 19A. It should be noted that the first gate interconnect contacts (e.g., 318) may be biased differently than the second gate interconnect contacts (e.g., 319). In another example, the first gate interconnect contacts (e.g., 318) can be tied to the second gate interconnect contacts (e.g., 319) based on the circuit designs.

Figure 32:
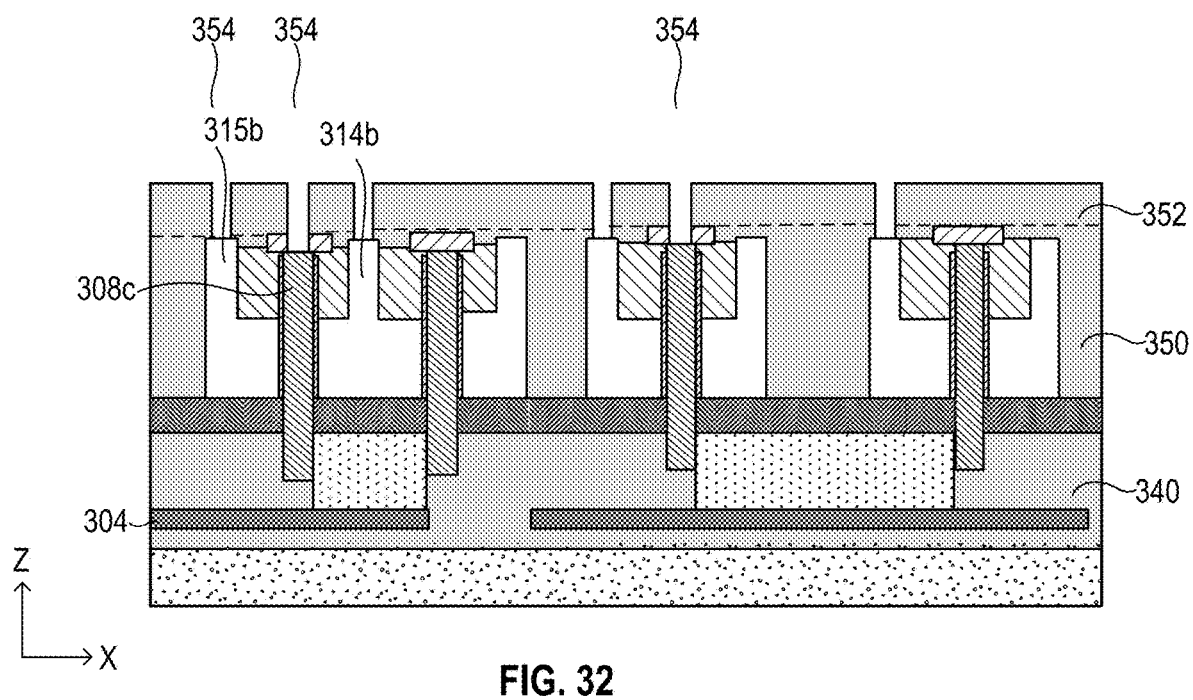

FIGS. 3-6, 20-29, and 32-34 are cross-sectional views of various intermediate steps in a process flow to fabricate the semiconductor device 300B, where a hookup for the buried power rail below the active devices is provided. The process flow can start with FIGS. 3-6, proceed to FIGS. 20-29, and start the process illustrated in FIG. 32. As shown in FIG. 32, the etching process mentioned in FIG. 30 can be performed based on the etch mask to form a plurality of contact openings 354. The contact openings 354 can uncover the first and second gate electrodes 314-315, and the second S/D regions (e.g., 308c) of the semiconductor structures. The BPRs (e.g., 304) can still be covered by the dielectric layer 352, the dielectric layer 350, and the dielectric structure 340.

Figure 33:
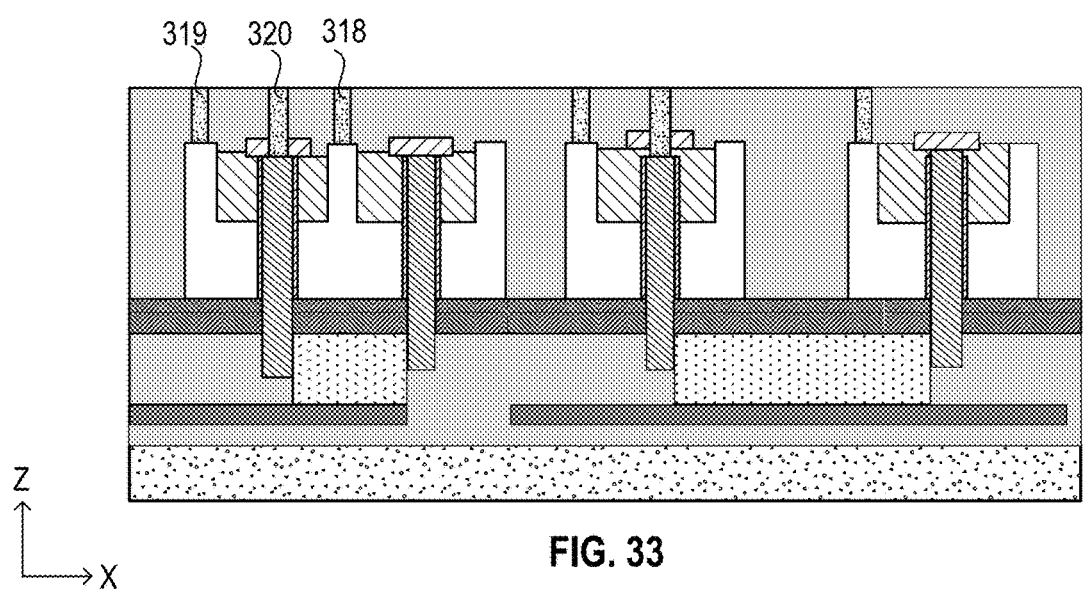

In FIG. 33, a metallization process can be performed to fill the contact openings 354 with a conductive material. Accordingly, the first gate interconnect contacts (e.g., 318), the second gate interconnect contacts (e.g., 319), and the second S/D interconnect structures (e.g., 320) can be formed.

Figure 34:
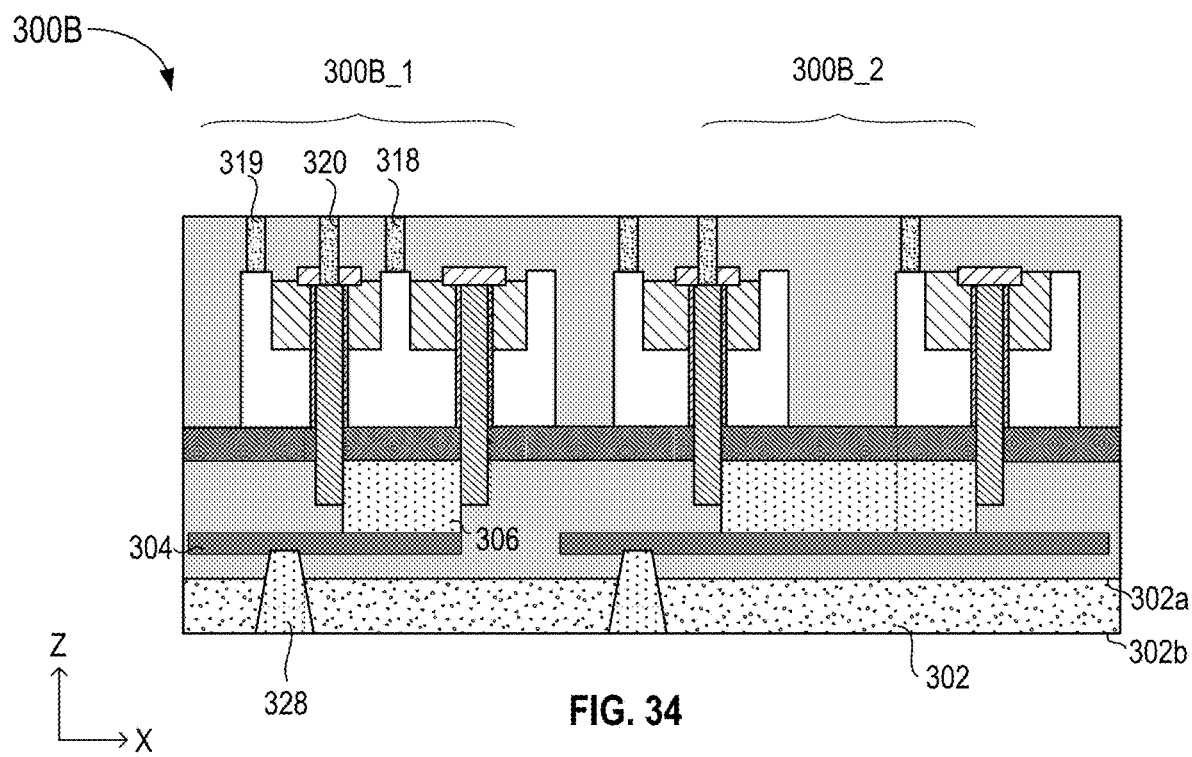

In FIG. 34, the S/D contact 328 can be formed to extend through the substrate 302 from the bottom surface 302b of the substrate 302 to contact the BPR 304. The first S/D interconnect structure 306 can be coupled to the S/D contact 328 through the BPR 304. Accordingly, the semiconductor device 300B can be formed which can be identical to the semiconductor device 300B shown in FIG. 19B.

Figure 35A:
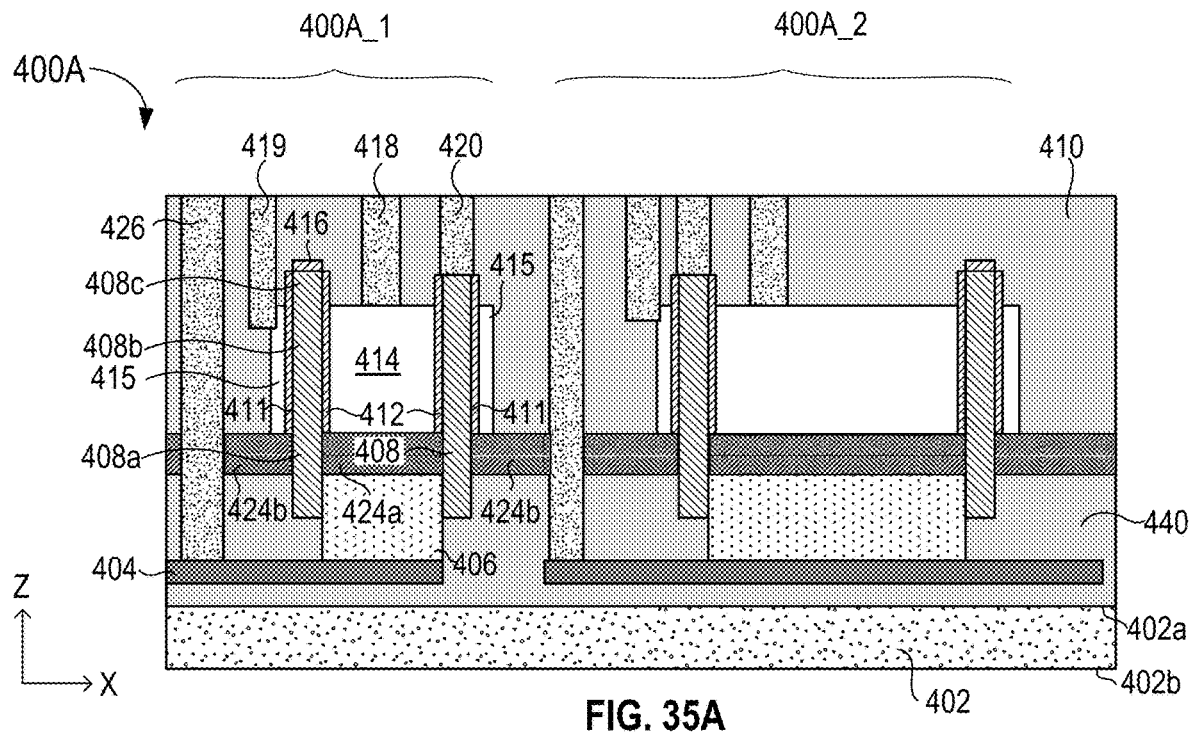
FIG. 35A is a cross-sectional view of a fifth exemplary vertical transistor, in accordance with some embodiments.
Figure 35B:
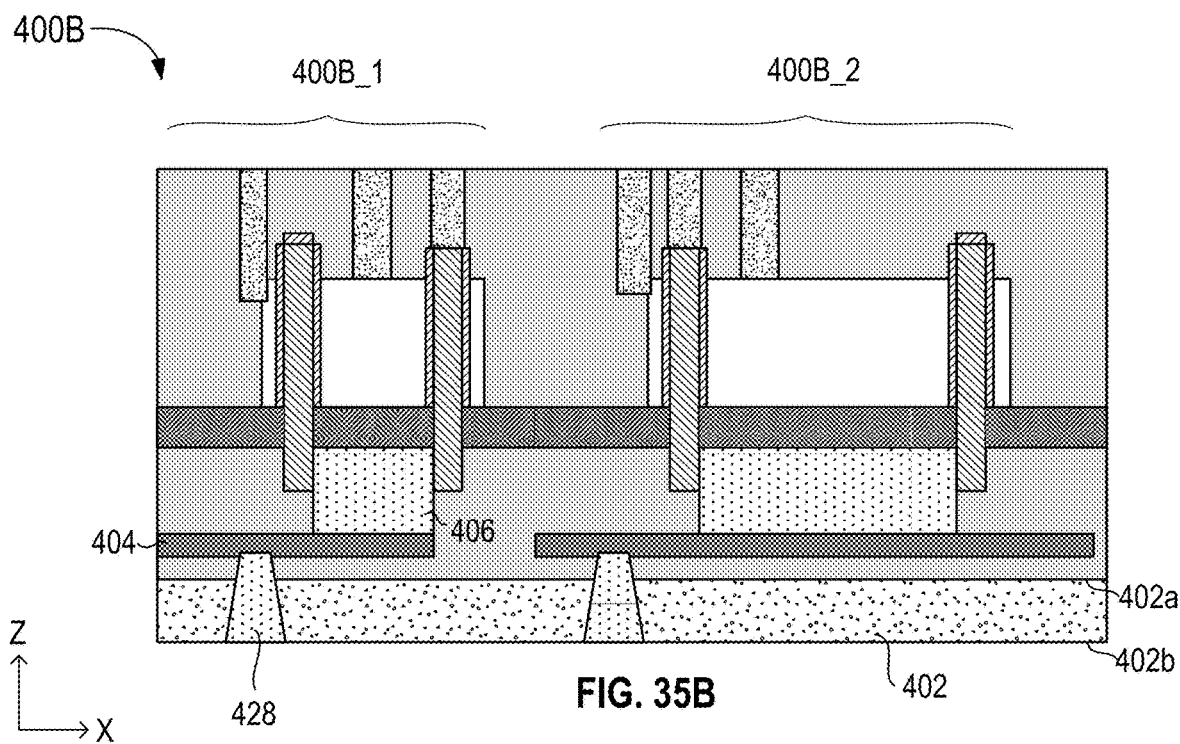
FIG. 35B is a cross-sectional view of a sixth exemplary vertical transistor, in accordance with some embodiments.

FIG. 35A shows a cross-sectional view of first exemplary semiconductor device 400A that are formed based on the third process flow. FIG. 35B shows a cross-sectional view of second exemplary semiconductor device 400B that are formed based on the third process flow. The third process flow is generally similar to the second process flow that is discussed in FIGS. 19A and 19B, but provides a reduction in metal gate electrode usage and also contains options for S/D regions hookup.

As shown in FIG. 35A, the first semiconductor device 400A can include a first transistor 400A_1 and a second transistor 400A_2 that are formed over a substrate 402. The first transistor 400A_1 and the second transistor 400A_2 can have different dimensions but similar structures. For simplicity and clarity, the structures of the first transistor 400A_1 and the second transistor 400A_2 can be discussed based on the first transistor 400A_1.

Still referring to FIG. 35A, the first transistor 400A_1 can include a BPR 404 formed over a top surface 402a of a substrate 402, where the substrate 402 can include an opposing bottom surface 402b. The first transistor 400A_1 can include a semiconductor structure 408 formed over the BPR 404. The semiconductor structure 404 can be tube-shaped and extend along a vertical direction (e.g., Z direction) perpendicular to the substrate 402. The first transistor 400A_1 can further include a first S/D region 408a over the BPR 304, a gate region 408b over the first S/D region 408a, and a second S/D region 408c over the gate region 408b. The first transistor 400A_1 can include a first S/D interconnect structure 406 extending from the BPR 404 and further into the first transistor 400A_1 such that a top portion of the first S/D interconnect structure 406 is surrounded by the first S/D region 408a of the first transistor 400A_1. The first transistor 400A_1 can also include a first gate oxide 412 formed along an inner surface of the gate region 408b and an inner surface of the second S/D region 408c, and a second gate oxide 411 formed along an outer surface of the gate region 408b and an outer surface of the second S/D region 408c to surround the gate region 408b and the second S/D region 408c. The first transistor 400A_1 can further include a first gate electrode 414 formed along sidewalls of the first gate oxide 412 in the gate region 408b such that the first gate electrode 414 is surrounded by the gate region 408b, and a second gate electrode 415 formed along sidewalls of the second gate oxide 411 to surround the gate region 408b. The first transistor 400A_1 can include a second S/D interconnect structure 420 positioned over and coupled to the second S/D region 408c.

In some times, cap layers can be positioned on top surfaces of the semiconductor structures. For example, a cap layer 416 can be positioned on a top surface of the semiconductor structure 408. In some embodiments, the first gate oxide 412, the second gate oxide 411, and the cap layer 416 can be made of a same dielectric material, such as a high-k material or $SiO_2$.

In some embodiments, a cross-section of the semiconductor structure 408 obtained along a direction parallel (e.g., X direction) to the substrate 402 can include one of a circular ring shape, a square ring shape, a rectangular ring shape, and an oval ring shape.

The first transistor 400A_1 can also include a first dielectric layer 424. The first dielectric layer 424 can include (i) a first portion 424a positioned between the first S/D interconnect structure 406 and the first gate electrode 414 and surrounded by the first S/D region 408a, and (ii) a second portion 424b formed along an outer surface of the first S/D region 408a so as to surround the first S/D region 408a. The first transistor 400A_1 can also include a first gate interconnect contact 418 positioned over and coupled to the first gate electrode 414, and a second gate interconnect contact 419 positioned over and coupled to the second gate electrode 415.

In an embodiment, the first transistor 400A_1 can include a S/D contact 426 positioned adjacent to the second gate electrode 415 and extending from the BPR 404 in the vertical direction such that the first S/D interconnect structure 406 can be coupled to the S/D contact 426 through the BPR 404.

The first semiconductor device 400A can also include a dielectric structure 440 that is positioned between the BPRs (e.g., 404) and the first dielectric layer 424, and a dielectric structure 410 that is positioned over the first dielectric layer 424. As shown in FIG. 35A, the gate regions (e.g., 408b) and the second S/D regions (e.g., 408c) of the semiconductor structures (e.g., 408), the gate interconnect contacts (e.g., 418), and the second S/D interconnect structures (e.g., 420) can be positioned in the dielectric structure 410. The dielectric structures 410 and 440 can include one or more dielectric layers.

FIG. 35B is a cross-sectional view of second exemplary semiconductor device 400B that are formed based on the third process flow. The second semiconductor device 400B can include a first transistor 400B_1 and a second transistor 400B_2 that may have different dimensions. Compared to the first transistor 400A_1 in semiconductor device 400A, the first transistor 400B_1 in semiconductor device 400B may not include the S/D contact 426, but can include a S/D contact 428 extending through the substrate 402 from the bottom surface 402b of the substrate 402 to contact the BPR 404, where the first S/D interconnect structure 406 can be coupled to the S/D contact 428 through the BPR 404.

Figure 36:
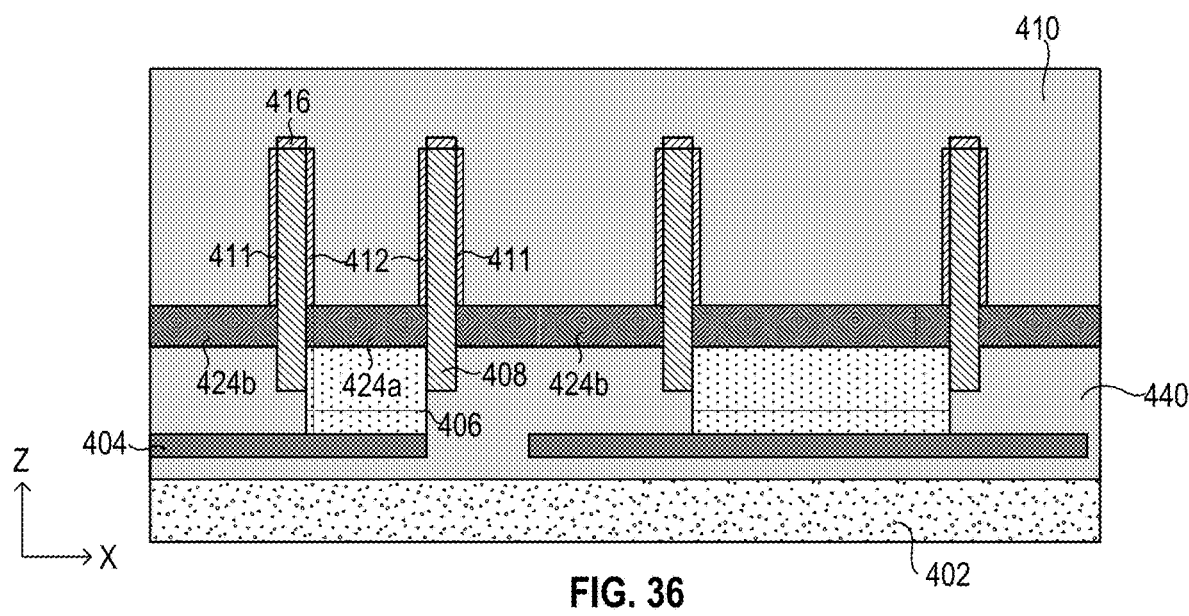

FIGS. 3-6, 20-21, and 36-41 are cross-sectional views of various intermediate steps in a process flow to fabricate the semiconductor device 400A, in accordance with some embodiments. The process flow can start with FIGS. 3-6, proceed to FIGS. 20-21, and then continue the process at FIG. 36. As shown in FIG. 36, the dielectric structure 410 can be deposited over the first dielectric layer 424. The dielectric structure 410 can cover the semiconductor structures (e.g., 408) such that a top surface of the dielectric structure 410 is over the top surfaces of the semiconductor structures.

Figure 37:
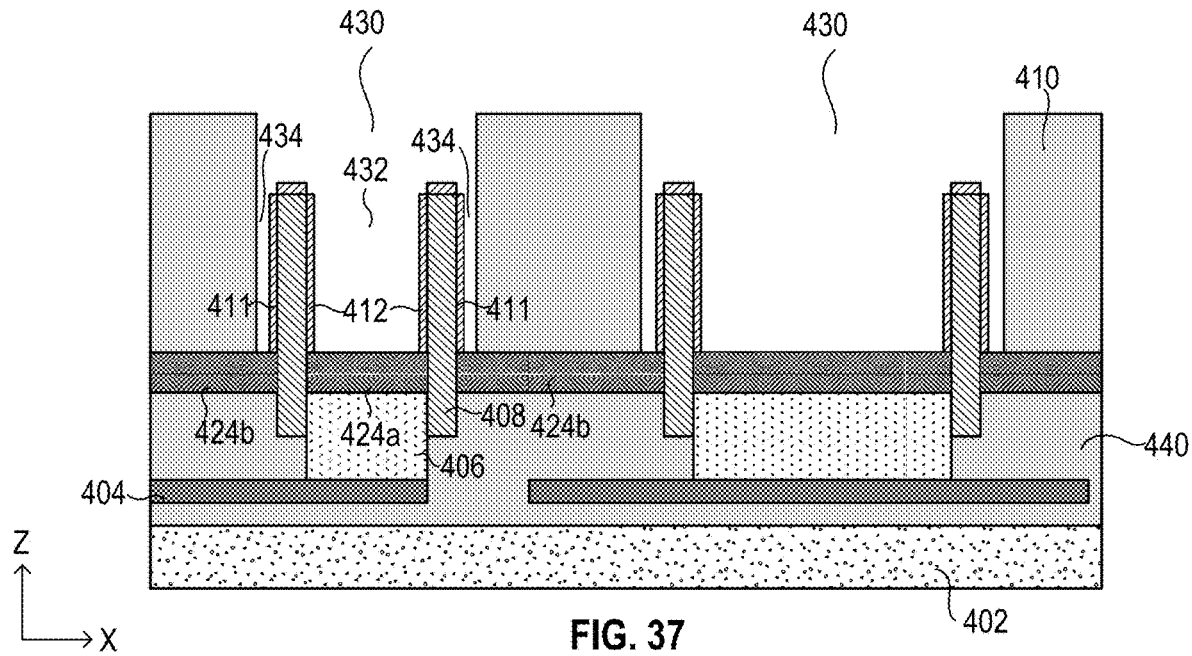

In FIG. 37, openings 430 can be formed in the dielectric structure 410 by a patterning process. The patterning process can include a photolithography process and an etching process. The photolithography process can introduce an etching mask with patterns on the dielectric structure 410 and the etching process can transfer the patterns into the dielectric structure 410 to form the openings 430. The openings 430 can uncover core regions of the semiconductor structures and none-core regions of the semiconductor structures. For example, the core region 432 and the non-core region of 434 of the semiconductor structure 408 are uncovered by the opening 430 in FIG. 37.

Figure 38:
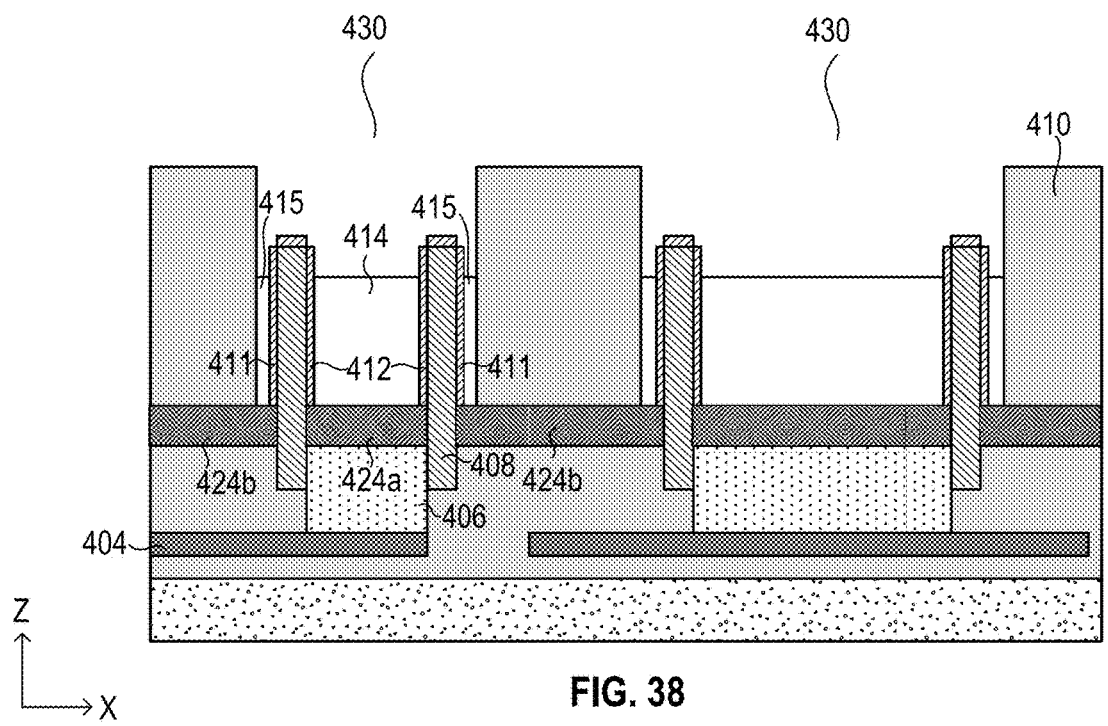

In FIG. 38, the first gate electrode 414 and the second gate electrode 415 can formed in the core region 432 and the non-core region of 434 respectively. In order to form the first gate electrode 414 and the second gate electrode 415, a conductive material can be deposited in the openings 430, and an etching process can be applied to recess the conductive material. The conductive material remains in the openings 430 becomes the first gate electrode 414 and the second gate electrode 415.

Figure 39:
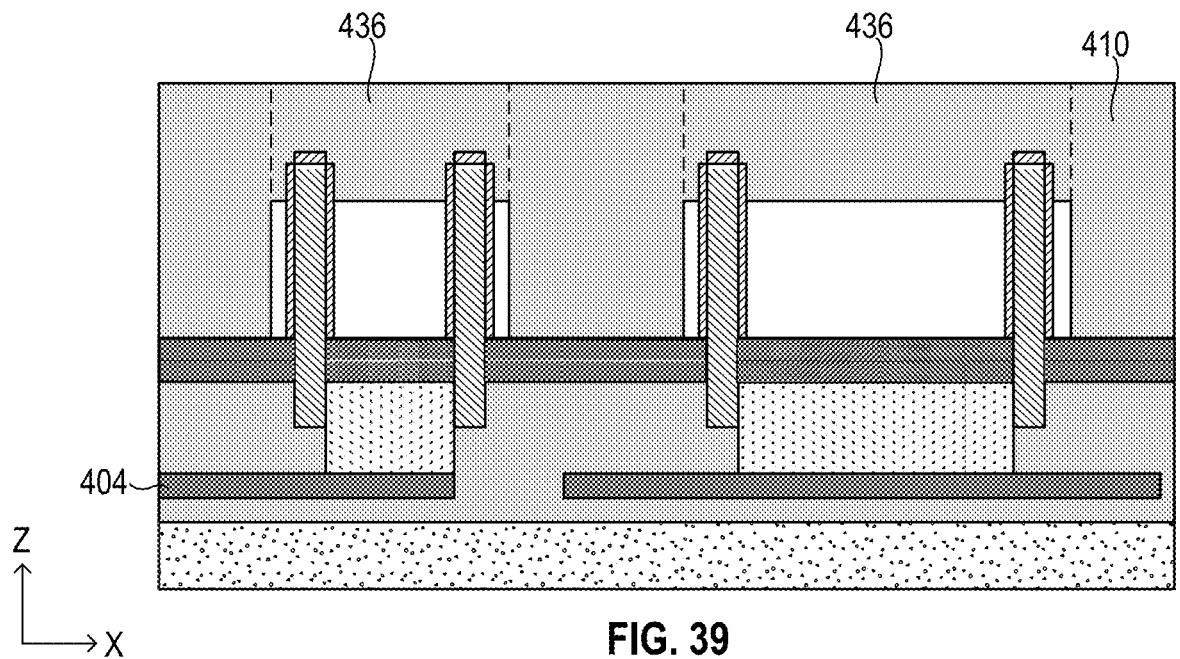

In FIG. 39, a dielectric layer 436 can be deposited to fill the openings 430 such that the first gate electrode 414 and the second gate electrode 415 are covered by the dielectric layer 436. A surface planarization can be subsequently applied to remove overburden of the dielectric layer 436 on the top surface of the dielectric structure 410. In some embodiments, the dielectric layer 436 and the dielectric structure 410 can be made of a same dielectric material.

Figure 40:
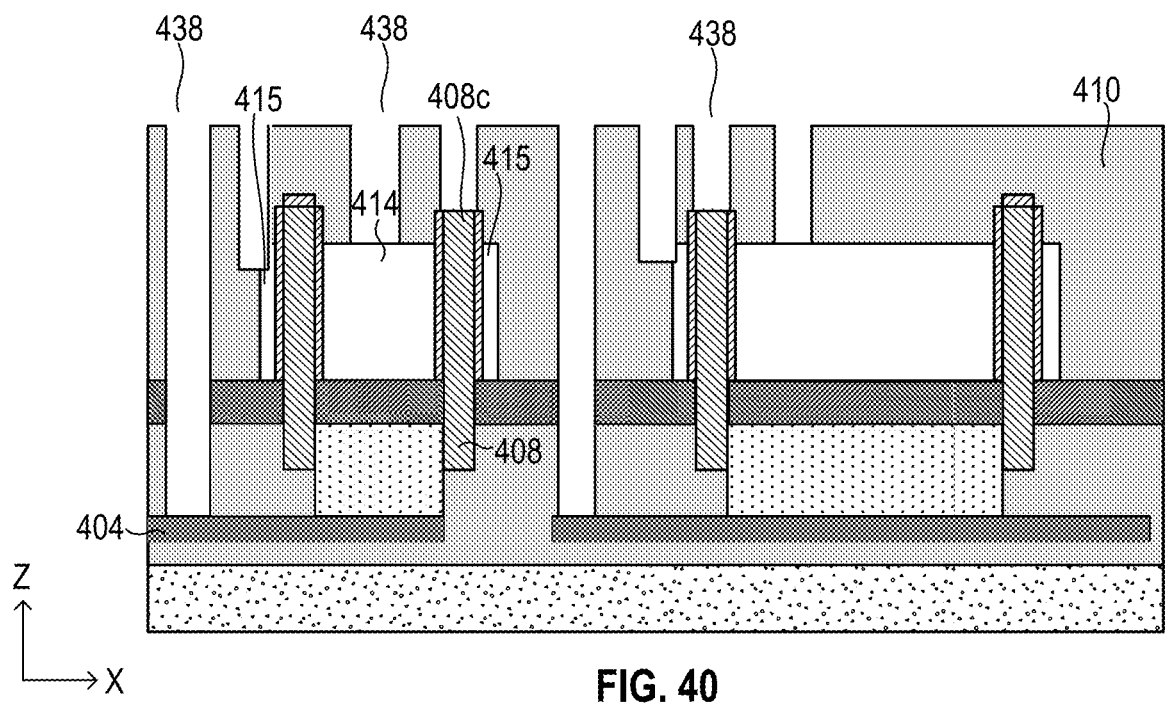

In FIG. 40, an etch mask (not shown) can be formed over the dielectric structure 410, and an etching process can be performed based on the etch mask to form a plurality of contact openings 438. The contact openings 438 can uncover the BPRs (e.g., 404), the first and second gate electrodes (e.g., 414 and 415), and the second S/D regions (e.g., 408c) of the semiconductor structures.

Figure 41:
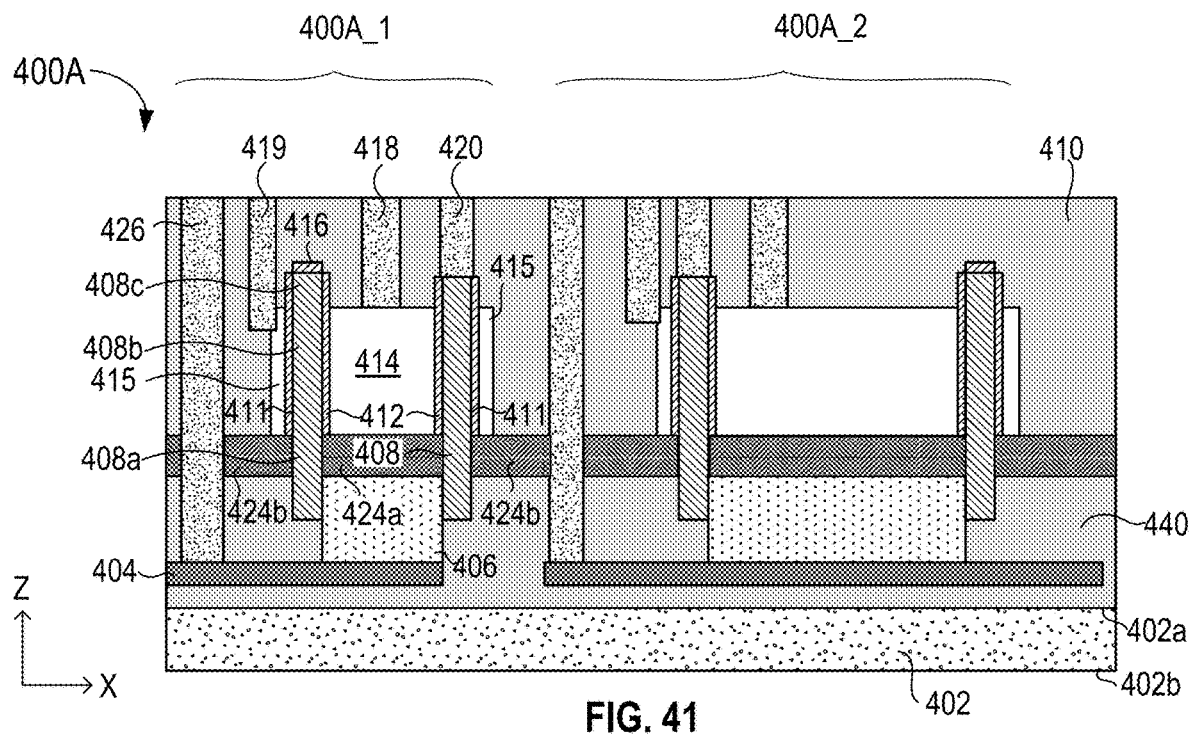

In FIG. 41, a metallization process can be performed to fill the contact openings 438 with a conductive material. Accordingly, the S/D contacts (e.g., 426), the first gate interconnect contacts (e.g., 418), the second gate interconnect contacts (e.g., 419), and the second S/D interconnect structures (e.g., 420) can be formed. When the metallization process is completed, a semiconductor device 400A can accordingly be formed. The semiconductor device 400A can have identical features to the semiconductor device 400A in FIG. 35A.

FIGS. 3-6, 20-21, 36-39, and 42 are cross-sectional views of various intermediate steps in a process flow to fabricate the semiconductor device 400B. The process flow can start with FIGS. 3-6, 20-21, 36-39, and then proceed to FIG. 42.

Figure 42:
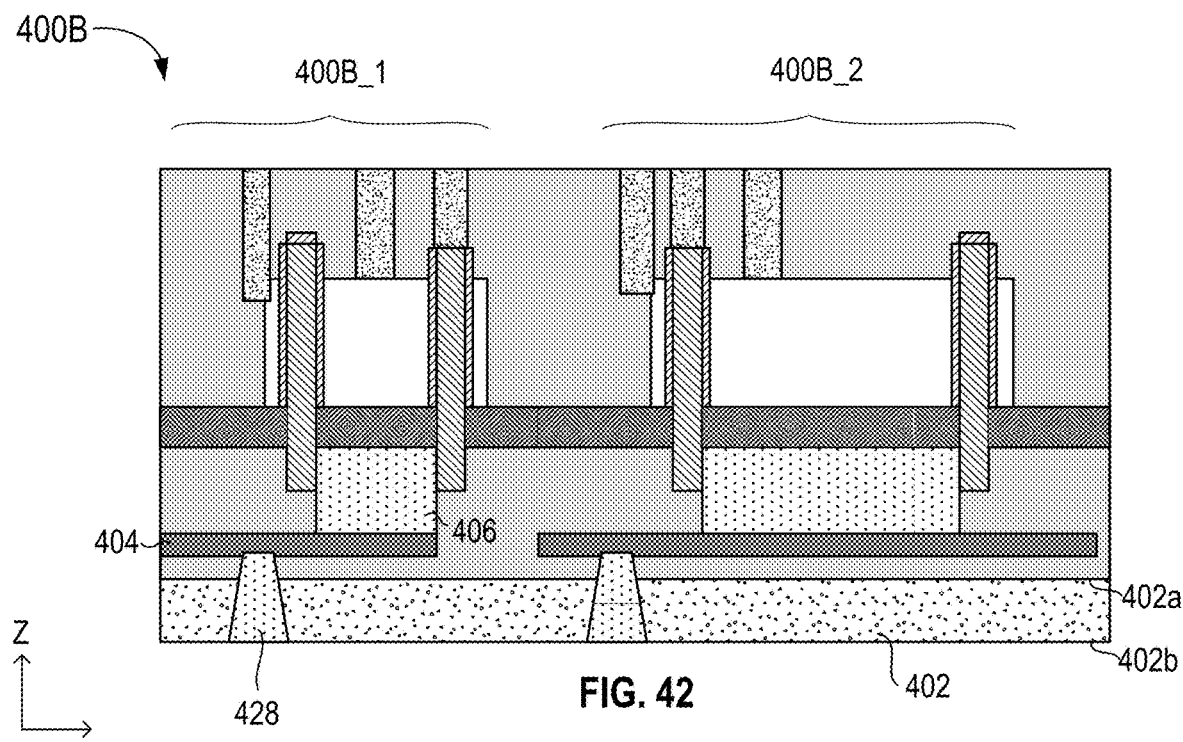

In FIG. 42, the S/D contact 428 can be formed to extend through the substrate 402 from the bottom surface 402b of the substrate 402 to contact the BPR 404. The first S/D interconnect structure 406 can be coupled to the S/D contact 428 through the BPR 404. Accordingly, the semiconductor device 400B can be formed which can be identical to the semiconductor device 400B shown in FIG. 35B.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
   a buried power rail (BPR) formed over a top surface of a substrate, the substrate including an opposing bottom surface;
   a semiconductor structure formed over the BPR, the semiconductor structure being tube-shaped and extending along a vertical direction perpendicular to the substrate, the semiconductor structure further including a first source/drain (S/D) region over the BPR, a gate region over the first S/D region, and a second S/D region over the gate region;
   a first S/D interconnect structure extending from the BPR and further into the semiconductor structure such that a top portion of the first S/D interconnect structure is surrounded by the first S/D region of the semiconductor structure;
   a gate structure that includes (i) a gate oxide formed along an inner surface of the gate region and (ii) a gate electrode formed along sidewalls of the gate oxide in the gate region such that the gate electrode is surrounded by the gate region; and
   a second S/D interconnect structure positioned over and coupled to the second S/D region.

2. The semiconductor device of claim 1, wherein a cross-section of the semiconductor structure obtained along a direction parallel to the substrate includes one of a circular ring shape, a square ring shape, a rectangular ring shape, and an oval ring shape.

3. The semiconductor device of claim 1, wherein:
   the gate oxide is further formed along an inner surface of the second S/D region, and
   the gate electrode includes a first portion arranged along the sidewalls of the gate oxide in the gate region and a second portion extending from the first portion and through the second S/D region such that a top surface of the second portion of the gate electrode is over a top surface of the second S/D region.

4. The semiconductor device of claim 3, further comprising:
   a first dielectric layer positioned in the first S/D region, the first dielectric layer further being arranged between the first S/D interconnect structure and the gate electrode and further surrounded by the first S/D region;
   a second dielectric layer positioned over the first portion of the gate electrode and surrounding the second portion of the gate electrode, the second dielectric layer further being positioned between the gate oxide in the second S/D region and the second portion of the gate electrode; and
   a gate interconnect contact positioned over and coupled to the second portion of the gate electrode.

5. The semiconductor device of claim 1, further comprising:
a S/D contact positioned adjacent to the semiconductor structure and extending from the BPR in the vertical direction such that the first S/D interconnect structure is coupled to the S/D contact through the BPR.

6. The semiconductor device of claim 1, further comprising:
a S/D contact extending through the substrate from the bottom surface of the substrate to contact the BPR, the first S/D interconnect structure being coupled to the S/D contact through the BPR.

7. A semiconductor device, comprising:
a buried power rail (BPR) formed over a top surface of a substrate, the substrate including an opposing bottom surface;
a semiconductor structure formed over the BPR, the semiconductor structure being tube-shaped and extending along a vertical direction perpendicular to the substrate, the semiconductor structure further including a first source/drain (S/D) region over the BPR, a gate region over the first S/D region, and a second S/D region over the gate region;
a first S/D interconnect structure extending from the BPR and further into the semiconductor structure such that a top portion of the first S/D interconnect structure is surrounded by the first S/D region of the semiconductor structure;
a first gate oxide formed along an inner surface of the gate region and an inner surface of the second S/D region, and a second gate oxide formed along an outer surface of the gate region and an outer surface of the second S/D region to surround the gate region and the second S/D region;
a first gate electrode formed along sidewalls of the first gate oxide in the gate region such that the first gate electrode is surrounded by the gate region, and a second gate electrode formed along sidewalls of the second gate oxide to surround the gate region; and
a second S/D interconnect structure positioned over and coupled to the second S/D region.

8. The semiconductor device of claim 7, wherein a cross-section of the semiconductor structure obtained along a direction parallel to the substrate includes one of a circular ring shape, a square ring shape, a rectangular ring shape, and an oval ring shape.

9. The semiconductor device of claim 7, further comprising:
a first dielectric layer including (i) a first portion positioned between the first S/D interconnect structure and the first gate electrode and surrounded by the first S/D region, and (ii) a second portion formed along an outer surface of the first S/D region so as to surround the first S/D region;
a first gate interconnect contact positioned over and coupled to the first gate electrode; and
a second gate interconnect contact positioned over and coupled to the second gate electrode.

10. The semiconductor device of claim 9, wherein:
the first gate electrode includes a first portion arranged along the sidewalls of the first gate oxide in the gate region and a second portion extending from the first portion of the first gate electrode and through the second S/D region such that a top surface of the second portion of the first gate electrode is substantially level with a top surface of the second S/D region, and
the second gate electrode includes a first portion arrange along the sidewalls of the second gate oxide in the gate region and a second portion extending from the first portion of the second gate electrode in the vertical direction such that a top surface of the second portion of the second gate electrode is substantially level with the top surface of the second S/D region.

11. The semiconductor device of claim 10, further comprising:
a second dielectric layer including (i) a first portion positioned over the first portion of the first gate electrode and surrounding the second portion of the first gate electrode, the first portion of the second dielectric layer being positioned between the first gate oxide in the second S/D region and the second portion of the first gate electrode, and (ii) a second portion positioned over the first portion of the second gate electrode and surrounded by the second portion of the second gate electrode, the second portion of the second dielectric layer further being positioned between the second portion of the second gate electrode and the second gate oxide in the second S/D region.

12. The semiconductor device of claim 7, further comprising:
a S/D contact positioned adjacent to the semiconductor structure and extending from the BPR in the vertical direction such that the first S/D interconnect structure is coupled to the S/D contact through the BPR.

13. The semiconductor device of claim 7, further comprising:
a S/D contact extending through the substrate from the bottom surface of the substrate to contact the BPR, the first S/D interconnect structure being coupled to the S/D contact through the BPR.

14. A method of manufacturing a semiconductor device, comprising:
forming a buried power rail (BPR) over a top surface of a substrate, the substrate including an opposing bottom surface;
forming a semiconductor structure over the BPR, the semiconductor structure being tube-shaped to include an inner surface and an outer surface, extending along a vertical direction perpendicular to the substrate, and including a first source/drain (S/D) region over the BPR, a gate region over the first S/D region, and a second S/D region over the gate region,
forming a first S/D interconnect structure extending from the BPR and further into the first S/D region of the semiconductor structure such that a top portion of the first S/D interconnect structure is surrounded by the first S/D region of the semiconductor structure;
forming a first dielectric layer over the first S/D interconnect structure in the first S/D region of the semiconductor structure such that the first dielectric layer is surrounded by the first S/D region of the semiconductor structure;
forming a first gate oxide along the inner surface of semiconductor structure and over the first dielectric layer;
forming a first gate electrode along sidewalls of the first gate oxide in the gate region of the semiconductor structure such that the first gate electrode is surrounded by the gate region; and
forming a second dielectric layer along the sidewalls of the first gate oxide and over the first gate electrode such that the second dielectric layer is surrounded by the second S/D region of the semiconductor structure.

15. The method of claim 14, further comprising:
forming a second S/D interconnect structure that is positioned over and coupled to the second S/D region of the semiconductor structure; and
forming a first gate interconnect contact that is positioned over and coupled to the first gate electrode.

16. The method of claim 15, wherein the forming the first dielectric layer further comprises:
forming the first dielectric layer further along the outer surface of the semiconductor structure so as to surround the first S/D region of the semiconductor structure.

17. The method of claim 16, further comprising:
forming a second gate oxide along the outer surface of semiconductor structure and over the first dielectric layer; and
forming a second gate electrode along sidewalls of the second gate oxide to surround the gate region of the semiconductor structure.

18. The method of claim 17, wherein the forming the first gate electrode further comprising:
forming (i) a first portion of the first gate electrode along the sidewalls of the first gate oxide in the gate region such that the first portion of the first gate electrode is surrounded by the gate region and (ii) a second portion of the first gate electrode extending from the first portion of the first gate electrode and through the second S/D region such that a top surface of the second portion of the first gate electrode is substantially level with a top surface of the second S/D region.

19. The method of claim 18, wherein the forming the second gate electrode further comprising:
forming (i) a first portion of the second gate electrode along the sidewalls of the second gate oxide in the gate region such that the first portion of the second gate electrode surrounds the gate region and (ii) a second portion of the second gate electrode extending from the first portion of the second gate electrode in the vertical direction such that a top surface of the second portion of the second gate electrode is substantially level with the top surface of the second S/D region.

20. The method of claim 19, wherein the forming the second dielectric layer further comprising:
forming a first portion of the second dielectric layer over the first portion of the first gate electrode and surrounding the second portion of the first gate electrode, the first portion of the second dielectric layer being positioned between the first gate oxide in the second S/D region and the second portion of the first gate electrode; and
forming a second portion of the second dielectric layer over the first portion of the second gate electrode and surrounding the second gate oxide in the second S/D region, the second portion of the second dielectric layer being positioned between the second portion of the second gate electrode and the second gate oxide in the second S/D region.

\* \* \* \* \*